(12) United States Patent
Gregor et al.

(10) Patent No.: US 10,403,476 B2
(45) Date of Patent: Sep. 3, 2019

(54) ACTIVE SHOWERHEAD

(71) Applicant: Lam Research Corporation, Fremont, CA (US)

(72) Inventors: Mariusch Gregor, Gilroy, CA (US); Thorsten Lill, Santa Clara, CA (US); David Trussell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 293 days.

(21) Appl. No.: 15/346,920

(22) Filed: Nov. 9, 2016

(65) Prior Publication Data
US 2018/0130640 A1    May 10, 2018

(51) Int. Cl.
*C23C 16/40* (2006.01)
*H01J 37/32* (2006.01)
*C23C 16/505* (2006.01)
*C23C 16/52* (2006.01)
*G01J 3/50* (2006.01)
(Continued)

(52) U.S. Cl.
CPC .... *H01J 37/32449* (2013.01); *C23C 16/4401* (2013.01); *C23C 16/4404* (2013.01); *C23C 16/45565* (2013.01); *C23C 16/45574* (2013.01); *C23C 16/45589* (2013.01); *C23C 16/505* (2013.01); *C23C 16/5096* (2013.01); *C23C 16/52* (2013.01); *G01J 3/50* (2013.01); *H01J 37/32091* (2013.01); *H01J 37/32183* (2013.01); *H01J 37/32697* (2013.01);
(Continued)

(58) Field of Classification Search
USPC .............. 118/715; 156/345.33, 345.34
See application file for complete search history.

(56) References Cited

U.S. PATENT DOCUMENTS 5,380,396 A * 1/1995 Shikida ............... F04B 43/043
118/728
5,614,026 A 3/1997 Williams
(Continued)

FOREIGN PATENT DOCUMENTS

JP    2008297597 A    12/2008
JP    3150053 U    4/2009
(Continued)

OTHER PUBLICATIONS

Anonymous: "Mass flow controller—Wikipedia, the free encyclopedia", Nov. 8, 2016, Article Tab, Retrieved from the internet: URL:https://en.wikipedia.org/wiki/Mass_flow_controller [retrieved on Nov. 8, 2016].
(Continued)

*Primary Examiner* — Rudy Zervigon
(74) *Attorney, Agent, or Firm* — Penilla IP, APC

(57) ABSTRACT

An active showerhead used for a plasma reactor is described. The active showerhead includes a plurality of substrate layers. The substrate layers include at least one actuator and transfer component. The actuator and transfer component is coupled to a gas line via a gas channel. The active showerhead further includes an electrode layer located below the substrate layers. The electrode layer and the actuator and transfer component both share an opening. The actuator and transfer component allows passage of one or more process gases received from the gas line and the gas channel into the opening without the need for a conventional gas box.

19 Claims, 17 Drawing Sheets

(51) Int. Cl.
*H01L 21/67* (2006.01)
*C23C 16/44* (2006.01)
*C23C 16/455* (2006.01)
*C23C 16/509* (2006.01)

(52) U.S. Cl.
CPC .. *H01J 37/32715* (2013.01); *H01J 37/32981* (2013.01); *H01L 21/67069* (2013.01); *H01L 21/67253* (2013.01)

(56) References Cited

U.S. PATENT DOCUMENTS

| | | | |
|---|---|---|---|
| 6,508,197 | B1 | 1/2003 | Omstead et al. |
| 6,872,258 | B2* | 3/2005 | Park ................. C23C 16/45565 118/715 |
| 7,645,341 | B2 | 1/2010 | Kennedy et al. |
| 7,712,434 | B2 | 5/2010 | Dhindsa et al. |
| 8,268,117 | B2 | 9/2012 | Bettencourt et al. |
| 8,460,466 | B2 | 6/2013 | Gurary |
| 8,551,248 | B2 | 10/2013 | Goodlin et al. |
| 8,551,890 | B2 | 10/2013 | Goodlin et al. |
| 8,562,785 | B2 | 10/2013 | Kang et al. |
| 8,573,152 | B2 | 11/2013 | De La Llera et al. |
| 8,721,791 | B2 | 5/2014 | Tiner et al. |
| 8,846,539 | B2 | 9/2014 | Dhindsa et al. |
| 8,980,379 | B2 | 3/2015 | Hanawa et al. |
| 9,099,398 | B2 | 8/2015 | Kang et al. |
| 9,126,214 | B2 | 9/2015 | Huang et al. |
| 9,245,717 | B2 | 1/2016 | Kang et al. |
| 2003/0010452 | A1* | 1/2003 | Park ................. C23C 16/45565 156/345.33 |
| 2003/0019580 | A1 | 1/2003 | Strang |
| 2004/0040503 | A1* | 3/2004 | Basceri ............. C23C 16/45514 118/715 |
| 2004/0082251 | A1* | 4/2004 | Bach ................. C23C 16/45563 445/60 |
| 2004/0123800 | A1 | 7/2004 | Schlottmann |
| 2005/0000423 | A1* | 1/2005 | Kasai ................. C23C 16/45565 118/715 |
| 2005/0103265 | A1 | 5/2005 | Gianoulakis et al. |
| 2005/0241765 | A1 | 11/2005 | Dhindsa et al. |
| 2006/0137607 | A1* | 6/2006 | Seo ...................... C23C 16/14 118/715 |
| 2008/0241387 | A1* | 10/2008 | Keto ..................... C23C 16/452 427/255.394 |
| 2009/0081878 | A1* | 3/2009 | Dhindsa ............ H01J 37/32091 438/729 |
| 2009/0095220 | A1 | 4/2009 | Meinhold et al. |
| 2009/0179085 | A1 | 7/2009 | Carducci et al. |
| 2009/0288604 | A1* | 11/2009 | Kim ................. C23C 16/45508 118/726 |
| 2010/0000683 | A1 | 1/2010 | Kadkhodayan et al. |
| 2010/0015687 | A1 | 1/2010 | Yao |
| 2010/0037823 | A1 | 2/2010 | Cho et al. |
| 2010/0288197 | A1 | 11/2010 | Choi et al. |
| 2011/0198034 | A1 | 8/2011 | Sun et al. |
| 2011/0256315 | A1 | 10/2011 | Tam et al. |
| 2011/0256729 | A1 | 10/2011 | Goodlin et al. |
| 2012/0027918 | A1 | 2/2012 | Tiner et al. |
| 2012/0064698 | A1 | 3/2012 | Olgado |
| 2012/0108072 | A1 | 5/2012 | Angelov et al. |
| 2012/0108076 | A1 | 5/2012 | Goodlin et al. |
| 2012/0222815 | A1 | 9/2012 | Sabri et al. |
| 2012/0315396 | A1 | 12/2012 | Endo et al. |
| 2013/0240637 | A1 | 9/2013 | Goodlin et al. |
| 2014/0158792 | A1 | 6/2014 | Meinhold et al. |
| 2014/0209027 | A1 | 7/2014 | Lubomirksy et al. |
| 2014/0246521 | A1 | 9/2014 | Tiner et al. |
| 2015/0053794 | A1 | 2/2015 | Carducci et al. |
| 2015/0170977 | A1 | 6/2015 | Singh |
| 2016/0147234 | A1 | 5/2016 | Leeser et al. |

FOREIGN PATENT DOCUMENTS

| | | |
|---|---|---|
| JP | 5140321 B2 | 2/2013 |
| WO | WO 2009154889 A2 | 2/2010 |
| WO | WO 2012024033 A2 | 2/2012 |

OTHER PUBLICATIONS

ISR PCT/US20171058313, dated Feb. 6, 2018, 3 pages.

* cited by examiner

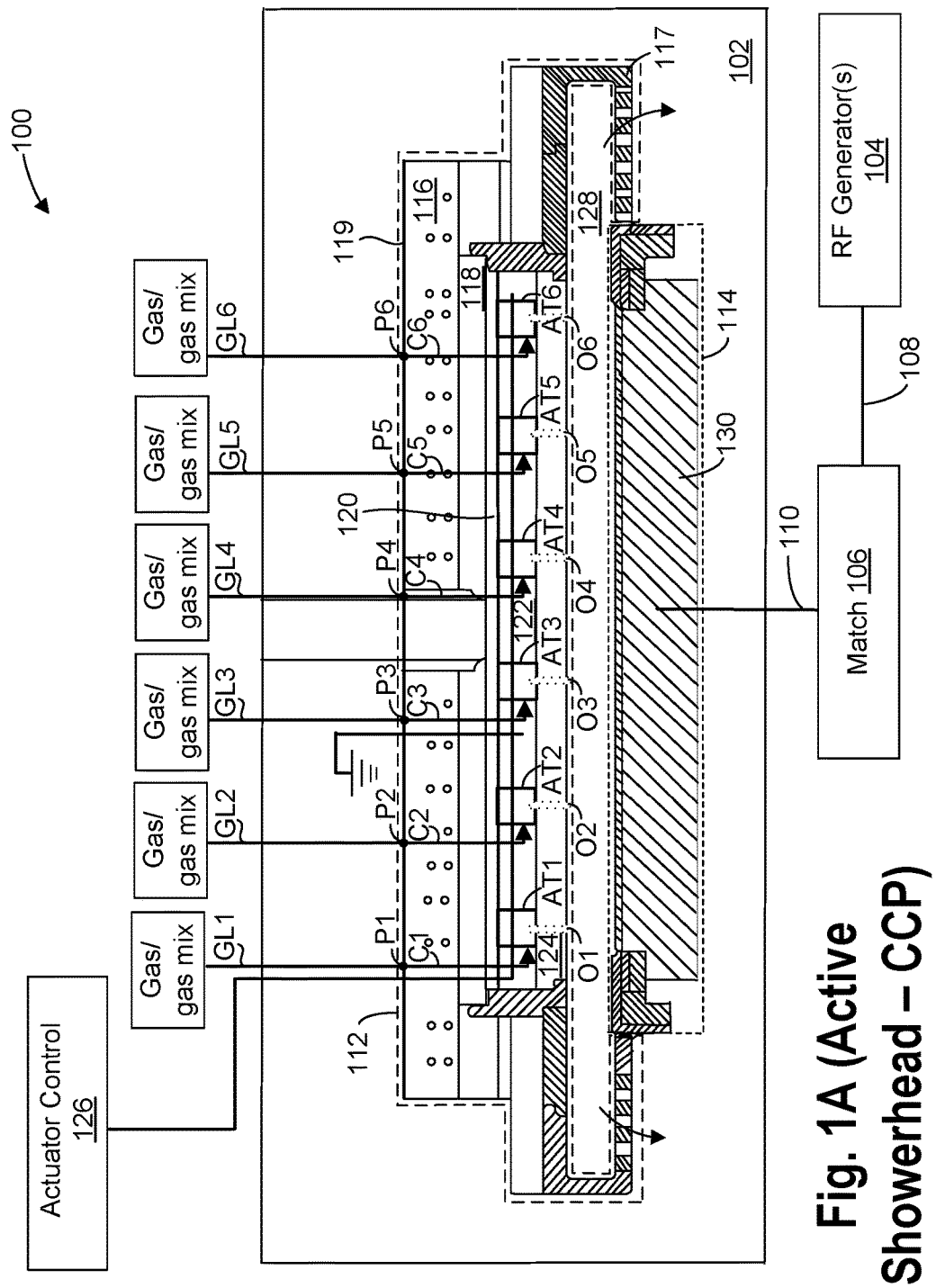
Fig. 1A (Active Showerhead – CCP)

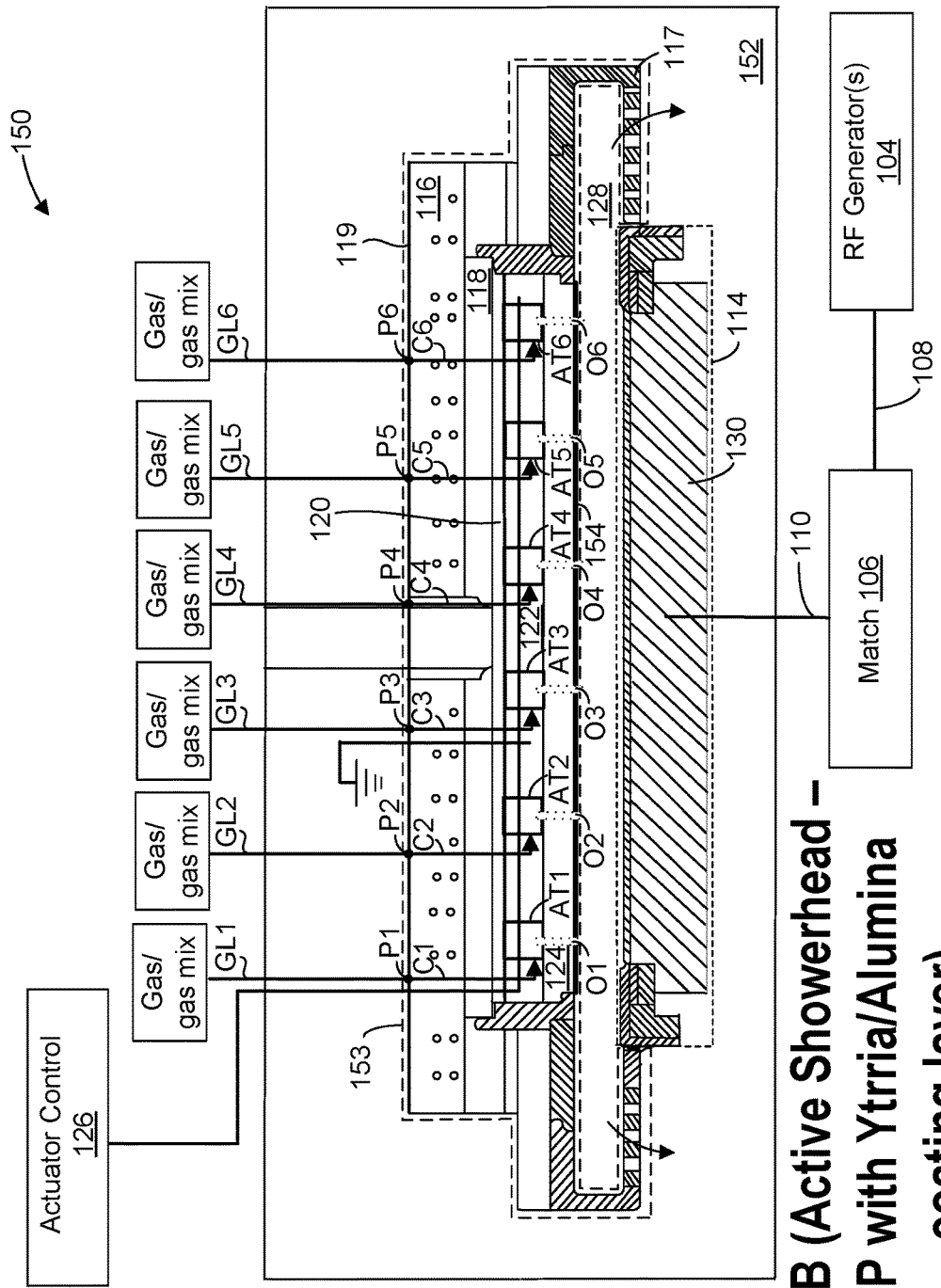
Fig. 1B (Active Showerhead – CCP with Ytrria/Alumina coating layer)

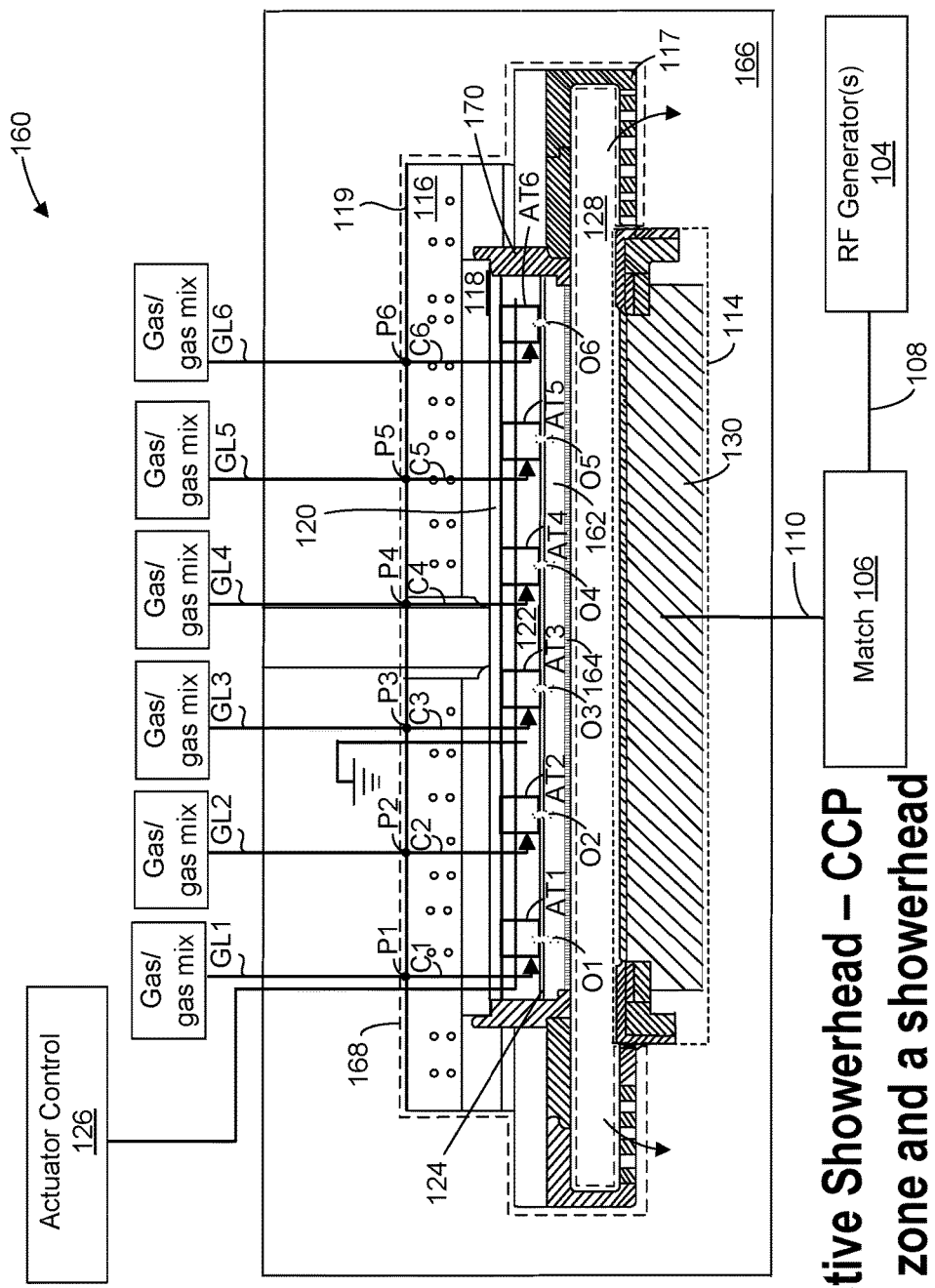
Fig. 1C (Active Showerhead – CCP with mixing zone and a showerhead plate)

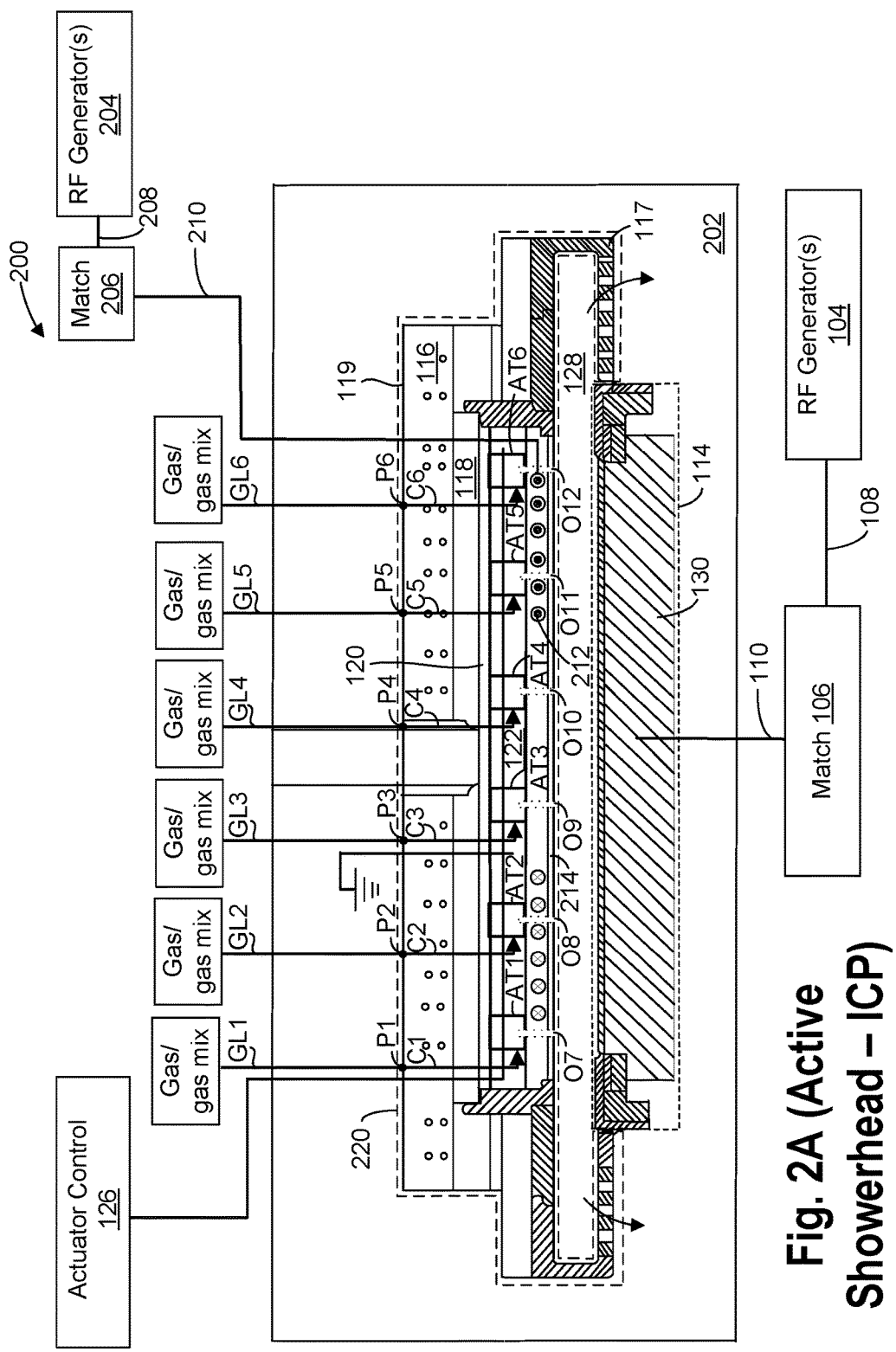
Fig. 2A (Active Showerhead – ICP)

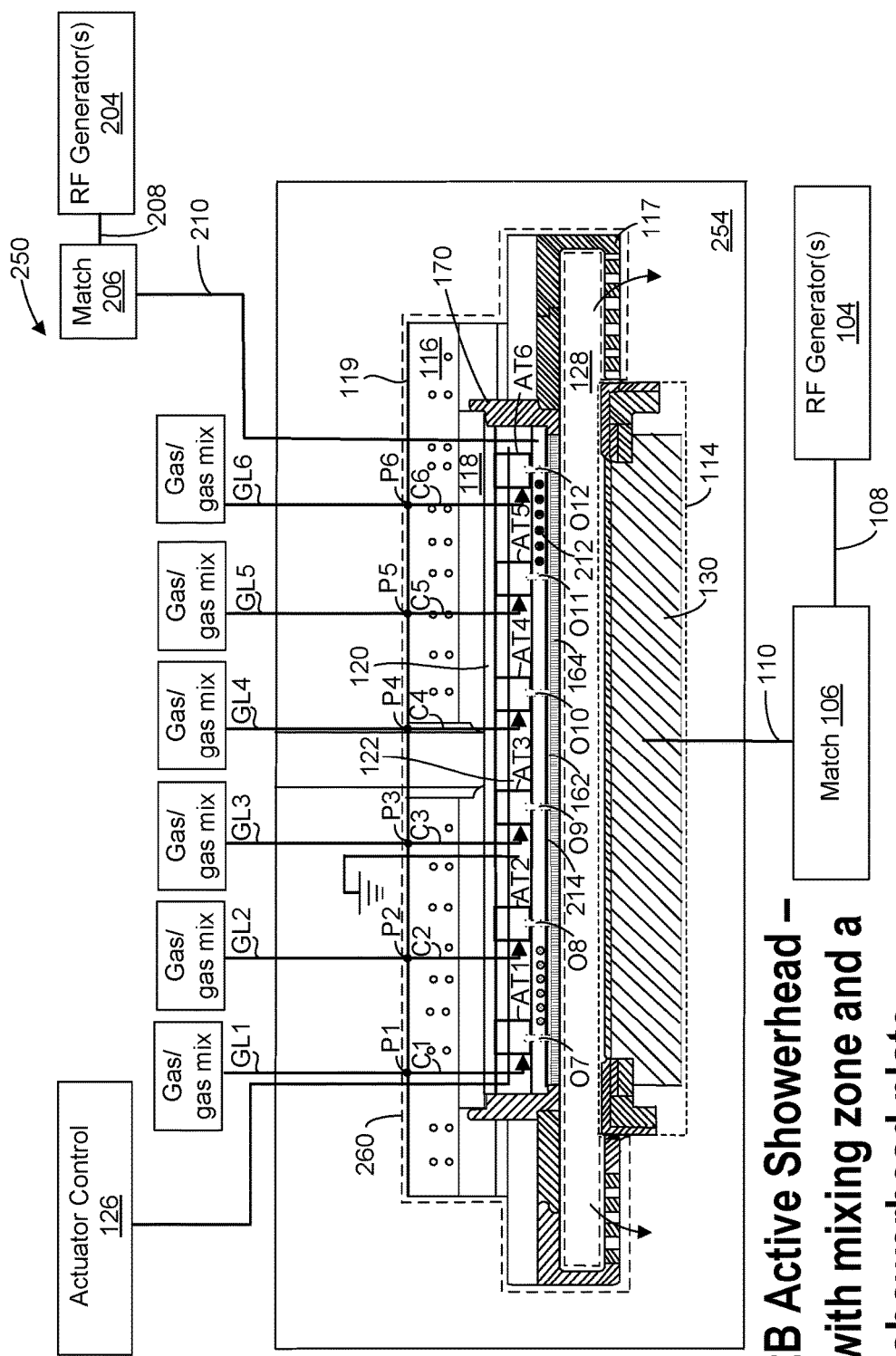
Fig. 2B Active Showerhead –
ICP with mixing zone and a
showerhead plate

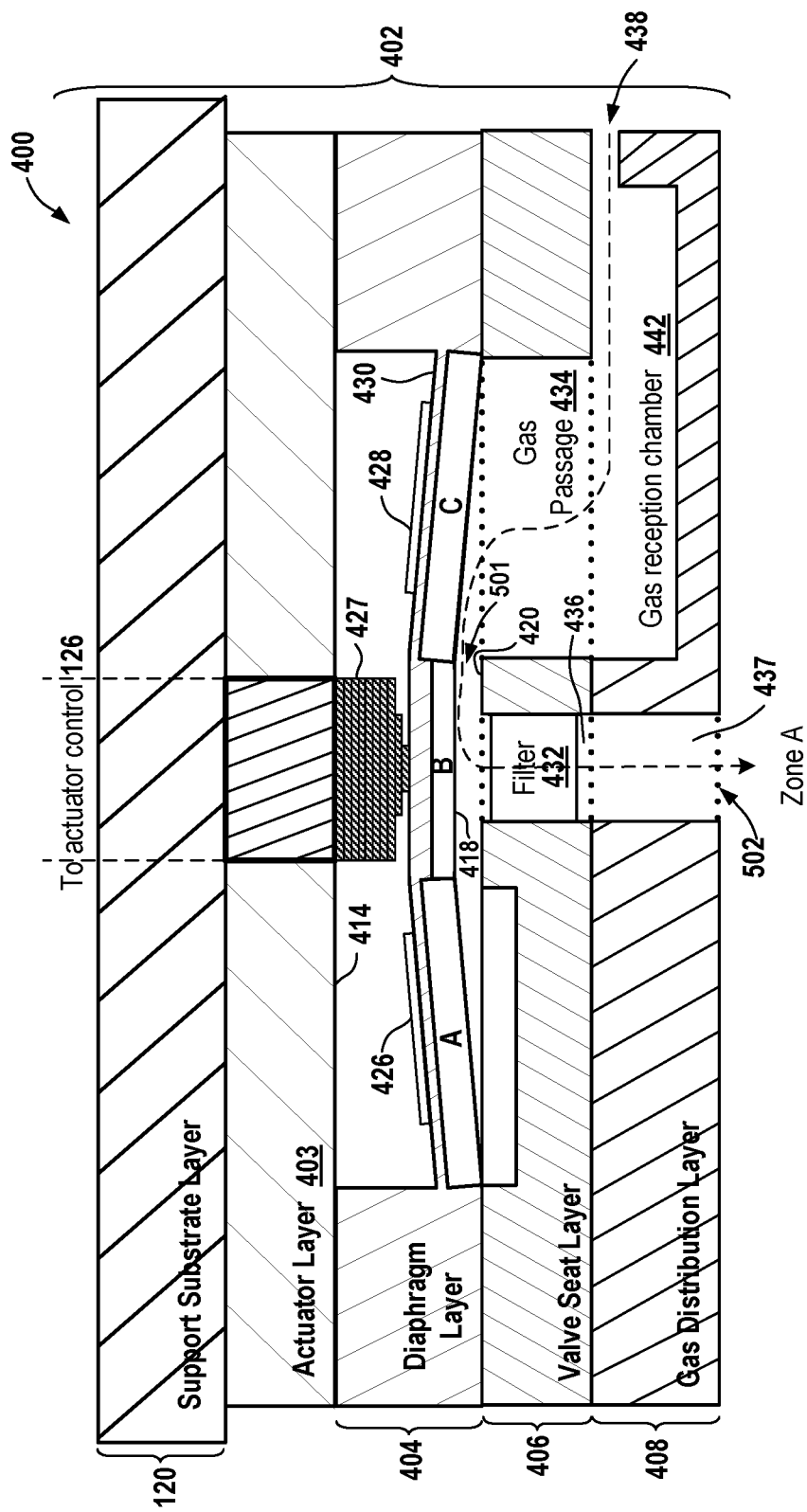
FIG. 5A (Retracted Position – Normally open)

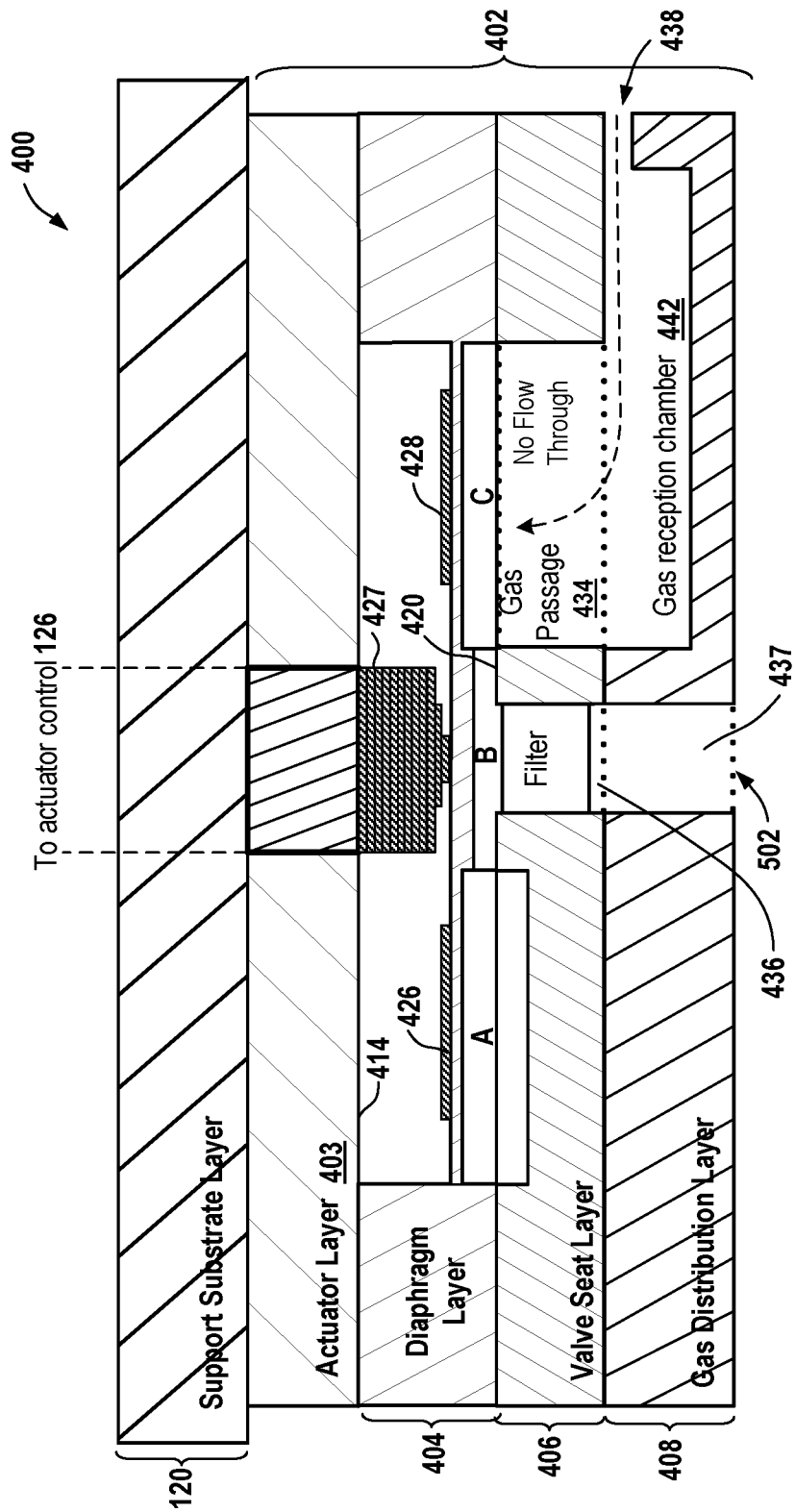
FIG. 5B (Extended Position – Closed)

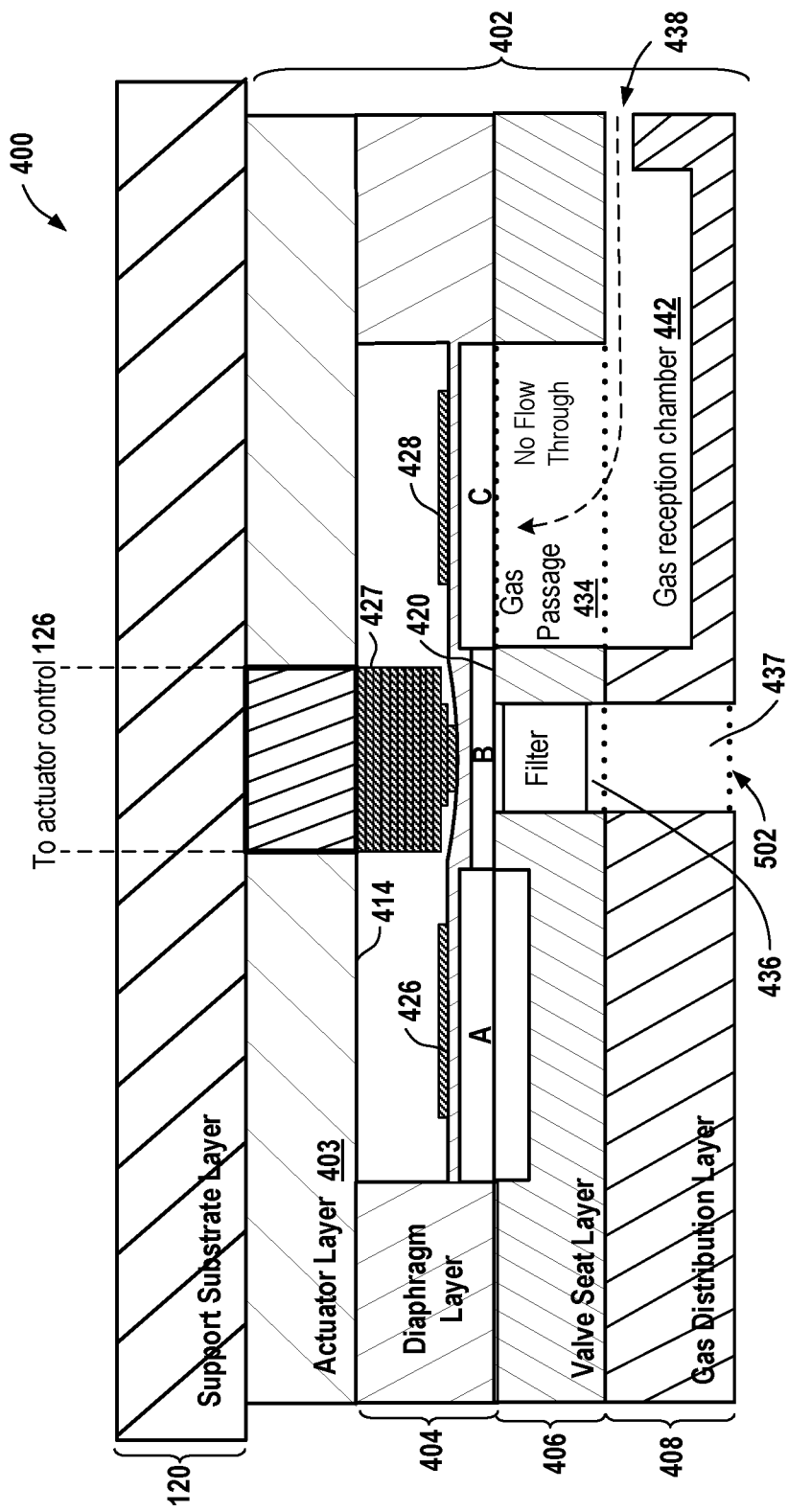
FIG. 6A (Extended Position - Normally closed)

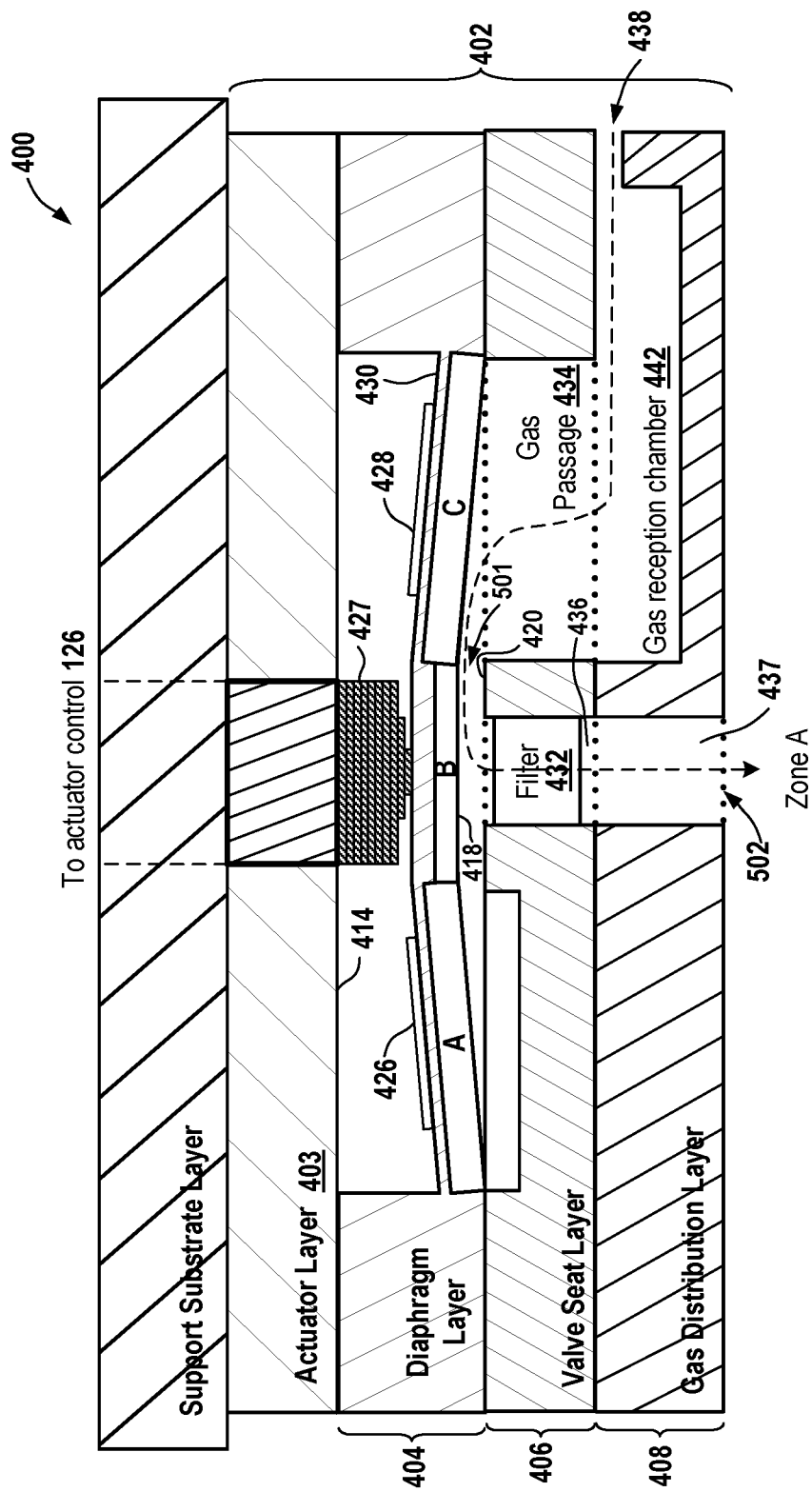
FIG. 6B (Retracted Position - Open)

ACTIVE SHOWERHEAD

FIELD

The present embodiments relate to an active showerhead and methods of gas injection into a reactor.

BACKGROUND

A plasma chamber is used to process substrates. For example, the plasma chamber is used to clean a wafer, or deposit materials, such as oxides, on the wafer, or etch the wafer, etc. During the processing of substrates, gas is supplied to the plasma chamber. A time in which the gas is supplied to the plasma chamber is important in switching between processes or in processing different wafers.

It is in this context that embodiments described in the present disclosure arise.

SUMMARY

A majority of gas delivery systems are adapted to process sequences which typically have a greater than 1 second duration with a majority of processes requiring greater than a 10 second duration. A gas box, which is a part of the gas delivery systems, includes a flow measurement and control device, e.g., a pressure measurement device, etc., and related components per gas species, e.g., a mass flow controller (MFC), gas stick assemblies, etc. The MFC is connected to a high pressure gas supply and regulates a gas flow to a given flow setpoint. The gas stick assemblies exhaust the accurately measured and controlled steady state flow into a gas mixing manifold. The gas mixing manifold then exhausts the gas mix into a plasma chamber through nozzles or a shower head. Alternatively or additionally, a gas splitter is utilized to split the gas mix into portions and exhaust each split portion into a zone(s) or nozzle(s).

The gas mixing manifold is a few feet of pipe length away from the plasma chamber. A volume of the gas mixing manifold and the volume and flow resistance of the shower head, the gas box, and the gas splitter result in a large gas mass capacity. This large gas mass capacity lengthens the time to change from one gas mix to the next inside the plasma chamber. Also, the gas mix may already react while in the gas mixing manifold. In addition, the MFC is slow to reach a steady state ranging between 100 milliseconds and 1000 milliseconds depending on MFC technology and other factors, such as, gas type. Moreover, gas delivery components, such as, the gas box, the gas splitter, the gas mixing manifold, of the gas delivery systems are made with stainless steel alloys and the gas delivery systems include of a large number of individual original equipment manufacturer (OEM) components, which are connected via even more numerous micro fittings. This has a potential for metal contamination. Also, the approach of first controlling a flow to generate the gas mix and then conducting it to one or in case of the gas splitter to multiple zones into the plasma chamber is slow and expensive. Furthermore, processing of substrates is complex due to a large number of the gas delivery components.

Embodiments of the disclosure provide systems, apparatus, methods and computer programs associated with an active showerhead and methods of injecting gas into a plasma reactor. It should be appreciated that the present embodiments can be implemented in numerous ways, e.g., a process, an apparatus, a system, a device, or a method on a computer readable medium. Several embodiments are described below.

In some embodiments, a plasma system is described. The plasma system includes an actuator control, a gas line, and a plasma reactor. The plasma reactor is coupled to the gas line and the actuator control. The plasma reactor includes a chuck assembly and an active showerhead. The active showerhead includes a plurality of substrate layers. The substrate layers include at least one actuator and transfer component coupled to the actuator control. The actuator and transfer component is coupled to the gas line via a gas channel. The active showerhead further includes an electrode layer located below the substrate layers. The electrode layer and the actuator and transfer component has an opening leading to a gap between the chuck assembly and the active showerhead. The actuator control controls the actuator and transfer component to allow passage of one or more process gases received from the gas line and the gas channel via the opening into the gap.

In various embodiments, another plasma system is described. The other plasma system also includes an actuator control, a gas line and a plasma reactor. The plasma reactor is coupled to the gas line and the actuator control. The plasma reactor includes a chuck assembly and an active showerhead. The active showerhead includes a plurality of substrate layers. The substrate layers include an actuator and transfer component coupled to the actuator control. The actuator and transfer component is coupled to the gas line via a gas channel. The active showerhead includes an electrode layer located below the substrate layers, a mixing chamber located below the electrode layer, and a showerhead plate located below the mixing chamber and having a plurality of openings. The electrode layer and the actuator and transfer component has an opening leading to the mixing chamber. The actuator control controls the actuator and transfer component to allow passage of one or more process gases received from the gas line and the gas channel via the opening of the electrode layer and the actuator and transfer component into the mixing chamber and further via the plurality of openings of the showerhead plate into the gap.

In some embodiments, an active showerhead is described. The active showerhead includes a plurality of substrate layers. The substrate layers include an actuator and transfer component. The actuator and transfer component is coupled to a gas line via a gas channel. The active showerhead further includes an electrode layer located below the substrate layers. The electrode layer and the actuator and transfer component has an opening. The actuator and transfer component allows passage of one or more process gases received from the gas line and the gas channel into the opening.

Some advantages of the herein described systems and methods include providing a plasma system, described herein, that facilitates a quick gas exchange, provides a high number of zones per active showerhead, and distributes multiple gas species and waves of gas into a plasma reactor and across a wafer surface. Further advantages of the plasma system include reducing a number of individual gas delivery components, thereby increasing reliability. For example, the plasma system eliminates the gas box per plasma reactor by utilizing a micro-electromechanical systems (MEMS) based substrate integrated into the active showerhead for flow control. Because of the elimination of the gas boxes and components such as the MFC, a considerable cost reduction is achieved as well. Also, the gas boxes occupy a lot of real estate. By eliminating the gas boxes, the real estate space is saved and can be used for other purposes.

In some embodiments, the methods, described herein, include integrating flow control in the active shower head, e.g., by incorporating a flow rate metrology tool in the active showerhead, by incorporating a strain sensor in the active showerhead, by incorporating a temperature sensor in the active showerhead, etc. Other advantages include providing a large number of MEMS valves, e.g., actuators and diaphragms and transfer channels, etc., and sensors in the active showerhead. The large number of valves translates to a large number of zones. With the large number of zones, gas distribution across a wafer is fine-tuned.

Additional advantages include having a valve, e.g., actuator, diaphragms, valve seat, transfer channels, passage channel, gas reception chamber, gas passage, etc., over the wafer. Such location of the valve minimizes time for gas exchange and time to change gas species distribution over the wafer. This allows for faster process step sequencing and in-situ gas distribution control, e.g., gas distribution control within the substrate layers. It enables new processing methods such as a rolling flush, which is an application of a gas wave injection mode, or gas distribution tuning, which is an application of dose control.

Further advantages of the herein described systems and methods include elimination of the gas box resulting in large savings and improved chamber packaging. Also, the gas flow splitter is eliminated. Also, a gas mix is created above the wafer, e.g., in a mixing chamber, etc., rather than in the mixing manifold.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1A is a block diagram of an embodiment of a system where an active showerhead is used in a capacitively coupled plasma (CCP) reactor.

FIG. 1B is a diagram of an embodiment of a system where an active showerhead used in a CCP reactor has an insulator layer.

FIG. 1C is a diagram of an embodiment of a system where an active showerhead used in a CCP reactor contains a mixing chamber.

FIG. 2A is a diagram of an embodiment of a system where an active showerhead is used in an inductively coupled plasma (ICP) reactor.

FIG. 2B is a diagram of an embodiment of a system where an active showerhead used in an ICP reactor containing a mixing chamber.

FIG. 5A is a diagram of an embodiment of the active showerhead of FIG. 4 in which the actuator is normally open in a retracted position.

FIG. 5B is a diagram of an embodiment of the active showerhead of FIG. 4 in which the actuator is closed in an extended position.

FIG. 6A is a diagram of an embodiment of the active showerhead of FIG. 4 in which the actuator is normally closed in an extended position.

FIG. 6B is a diagram of an embodiment of the active showerhead of FIG. 4 in which the actuator is open in a retracted position.

DETAILED DESCRIPTION

Figure 3:
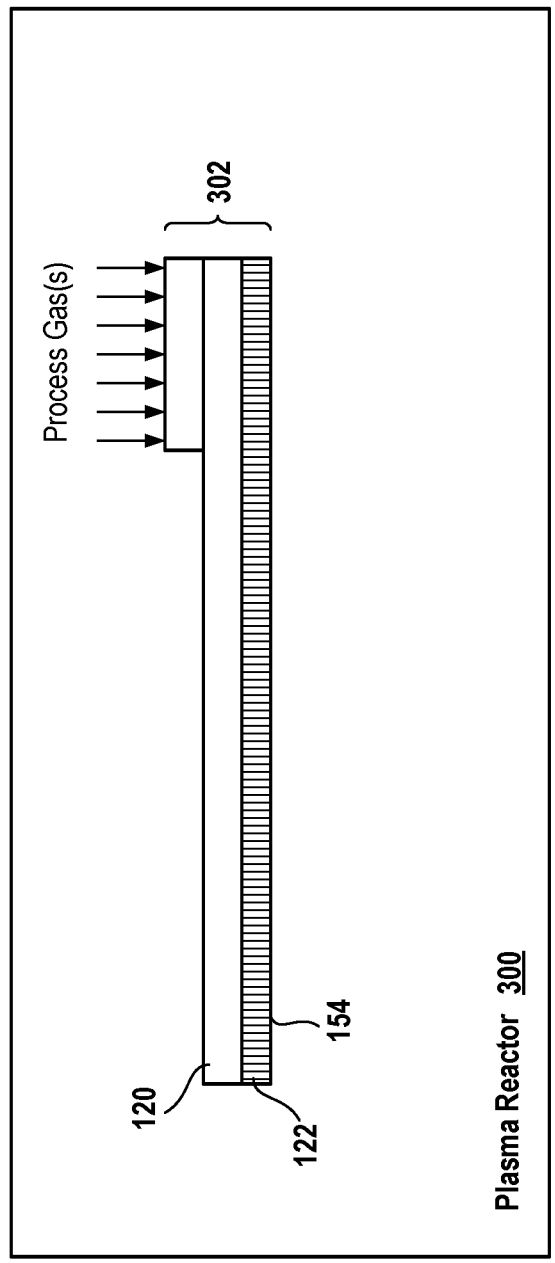
FIG. 3 is a diagram of an embodiment for illustrating a supply of one or more process gases to an active showerhead of a plasma reactor.

The following embodiments describe an active showerhead and associated systems and methods for injecting gas into a plasma reactor. It will be apparent that the present embodiments may be practiced without some or all of these specific details. In other instances, well known process operations have not been described in detail in order not to unnecessarily obscure the present embodiments.

In some embodiments, an active showerhead with integrated valves to directly inject gas into the plasma reactor is described. As an example, each valve is as close as 400 micrometers from a corresponding hole opening to the plasma reactor. The hole opening is on a top surface of the plasma reactor. As another example, the valves are as close as 400 micrometers to 2000 micrometers from the hole opening on the top surface of the plasma reactor. A gas line is fitted to the hole opening. Each valve is connected to a single gas line and process gases mix inside the plasma reactor. There is no mixing of the process gases in a gas mixing manifold outside the plasma reactor. The vales are manufactured using micro-electromechanical systems (MEMS) technology on wafer substrates, e.g., silicon wafers.

In various embodiments, a large number of valves are built on wafer surfaces, e.g., 300 millimeter wafer surfaces, in parallel to process a wafer within the plasma reactor. Within the active showerhead, structures, e.g., sensors, diaphragms, actuators, gas passages, gas reception chambers, passage channels, etc., are formed on multiple wafers and wafers are attached together, e.g., bonded, to be stacked against a support substrate to make up the active showerhead. As such, the active showerhead is fully integrated. Flow accuracy is achieved by controlling supply pressure and calibrating flow resistance versus pressure and temperature for each valve. Since flow control components, e.g., strain sensors, temperature sensors, flow rate sensors, gas mass sensors, etc., are integrated in the active showerhead, a gas box that is dedicated for each plasma chamber is not needed.

The active showerhead enables a large number of zones, such as 128, a number of zones between 50 and 150, a number of zones between 20 and 100, etc. The large number of zones combined with fast actuation and minimal parasitic volume enables fast gas exchange in the plasma reactor and a high degree of uniformity control and compensation. The fast actuation and the minimal parasitic volume are achieved due to the elimination of the conventional gas box and the gas mixing manifold as well as the integration of the flow control components in the active showerhead.

In addition, a variety of types of gas injection is enabled, such as, for example, gas wave injection or dose control. For example, dose control is an injection of a defined dose per actuation of a single valve rather than a steady state flow through it. As another example, in gas wave injection, gas waves are created by actuating gas valves, such as, for example, starting from a center of the active showerhead radially and consecutively to an outer edge of the active showerhead. This improves expelling of a previous process' gas species from the plasma reactor and helps with cleaning processes. By using a large number of valves and overlapping dose injections, a virtual steady state flow is achieved if desired. A variety of processes are achieved using gas dose amounts rather than steady state flow control. For example, for very short process operations, a steady state flow cannot be reached and a gas dose over time is a more accurate metric.

FIG. 1A is a block diagram of an embodiment of a system 100 for injecting gas into a plasma reactor 102, which is capacitively coupled plasma (CCP) reactor. The system 100 includes the plasma reactor 102, one or more radio frequency (RF) generators 104, and a match 106, which is an impedance matching circuit (IMC). In some embodiments, the one or more RF generators 104 include an x megahertz (MHz) RF generator, a y MHz RF generator, and a z MHz RF generator, where x is 2, y is 27, and z is 60. In various embodiments, x is 400 kilohertz (kHz). In several embodiments, x is 400 kHz, y is 2 MHz, and z is 27 MHz. In various embodiments, y is 13.56 MHz instead of 27 MHz. In some embodiments, any other number of RF generators is used in the system 100. For example, the x and y MHz RF generators are used and the y MHz RF generator is not used. As another example, the y and z MHz RF generators are used and the x MHz RF generator is not used. As yet another example, the x and z MHz RF generators are used and the y MHz RF generator is not used. As another example, the one or more RF generators 104 include the x MHz RF generator, or the y MHz RF generator, or the z MHz RF generator, or a combination of two or more of the x, y, and z MHz RF generators. Each of the one or more RF generators 104 includes an RF power supply, such as, an RF oscillator that generates an RF signal.

The one or more RF generators 104 are coupled to the match 106 via corresponding one or more RF cables 108 and the match 106 is coupled to the plasma reactor 102 via an RF transmission line 110. Each of the one or more RF generators 104 is coupled to a corresponding input of the match 106 via a corresponding RF cable. An output of the match 106 is coupled to the RF transmission line 110.

The match 106 includes electric circuit components, e.g., inductors, capacitors, etc. to match an impedance of a load coupled to the output of the match 106 with an impedance of a source coupled to the input of the match 106. For example, the match 106 matches an impedance of the plasma reactor 102 and the RF transmission line 110 coupled to the output of the match 106 with an impedance of the one or more RF generators 104 and the one or more RF cables 108. The match 106 reduces a probability of power being reflected a direction towards the source, e.g., from the load towards the source.

The plasma reactor 108 includes an active showerhead 112 and a chuck assembly 114, which includes a chuck 130, such as, an electrostatic chuck (ESC). The chuck assembly 114 faces the active showerhead 112. The active showerhead 112 includes a thermal plate layer 116, an insulator layer 118, a substrate support layer 120, substrate layers 122, and an upper electrode 124, e.g., an electrode plate, a capacitive electrode plate, etc. An example of the thermal plate layer 116 includes one or more metal plates that are conductors of thermal energy. Another example of the thermal plate layer 116 includes a layer that includes one or more resistors that are supplied with an electric current to generate heat. An example of the insulator layer 118 is a layer that has aluminum nitride, or ceramic, or a combination thereof. The insulator layer 118 provides thermal insulation to the substrate support layer 122 from the thermal layer 116. The upper electrode 124 is made of a metal, e.g., aluminum, alloy of aluminum, etc., and is coupled to a ground potential. In some embodiments, the active showerhead 112 includes other components (not shown), e.g., an upper dielectric ring surrounding the upper electrode 124, an upper electrode extension surrounding the upper dielectric ring, a C-shroud 117 surrounding the upper electrode extension, etc.

The insulator layer 118 is located below the thermal layer 116 and above the substrate support layer 120 to be located between the thermal layer 116 and the substrate support layer 120. The substrate support layer 120 is located below the insulator layer 118 and above the substrate layers 122, and therefore is located between the insulator layer 118 and the substrate layers 122. The substrate layers 122 are located below the substrate support layer 120 and above the upper electrode 124, and so are located between the substrate support layer 120 and the upper electrode 124. The upper electrode 124 is located above a gap 128 and below the substrate layers 122 to be located between the gap 128 and the substrate layers 122. The gap 128 is formed between the active showerhead 112 and the chuck assembly 114. For example, the gap 128 is surrounded by the active showerhead 112 and the chuck assembly 114.

The chuck 130 includes a lower electrode made of a metal, e.g., aluminum, alloy of aluminum, etc. In various embodiments, other components, e.g., a lower dielectric ring surrounding the lower electrode, a lower electrode extension surrounding the lower dielectric ring, etc., of the chuck assembly 114 surround the chuck 130. In several embodiments, the chuck 130 includes a ceramic layer that is attached to a top surface of the lower electrode and a facility plate that is attached to a bottom surface of the lower electrode.

A substrate, e.g., a semiconductor wafer, is supported on an upper surface of the chuck 114 to process, e.g., deposit materials on, etch, clean, etc., the substrate. Integrated circuits, e.g., an application specific integrated circuit (ASIC), a programmable logic device (PLD), etc., are developed on the substrate and the integrated circuits are used in a variety of devices, e.g., cell phones, tablets, smart phones, computers, laptops, networking equipment, etc.

The system 100 further includes gas lines GL1, GL2, GL3, GL4, GL5, and GL6 that couple one or more corresponding gas cylinders to a top surface 119 of the active showerhead 112. For example, the gas lines GL1 through GL6 are bolted to the top surface 119 via corresponding metal connectors. As another example, the gas lines GL1 through GL6 are welded to the top surface 119. As yet another example, the gas line GL1 is connected at a point P1 on the top surface 119, the gas line GL2 is connected at a point P2 on the top surface 119, the gas line GL3 is connected at a point P3 on the top surface 119, the gas line GL4 is connected at a point P4 on the top surface 119, the gas line GL5 is connected at a point P5 on the top surface 119, and the gas line GL6 is connected at a point P6 on the top surface 119. In some embodiments, the top surface 119 of the active showerhead 112 is the same as a top surface of the thermal layer 116. In various embodiments, the top surface 119 of the active showerhead 112 is a top surface of a metal cover that is fitted to the top surface of the thermal layer 116.

In some embodiments, each gas line GL1 through GL6 is connected to a different gas cylinder. Each gas cylinder includes a process gas or a mix of process gases. It should be noted that there is no gas box coupled between the one or more corresponding gas cylinders and the plasma reactor 102. When the gas box is not included, a pressure monitor, of the gas box, used to measure a pressure of a process gas that is being supplied to a plasma reactor, is also not included. Examples of a process gases include an oxygen-containing gas, such as $O_2$. Other examples of the process gas include a fluorine-containing gas, e.g., tetrafluoromethane ($CF_4$), sulfur hexafluoride ($SF_6$), hexafluoroethane ($C_2F_6$), etc. In some embodiments, any other number of gas lines, e.g., one, two, three, five, ten, twenty, etc., are used than that illustrate in the system 100.

Each gas line is coupled to a corresponding gas channel C1, C2, C3. C4. C5, and C6 formed within the thermal layer 116, the insulator layer 118, the substrate support layer 120, and the substrate layers 122. For example, the gas lines GL1 through GL6 couple a gas cylinder to the substrate layers 122 via the corresponding gas channels C1 through C6.

Each gas channel is coupled to an actuation and transfer component (AT) of the substrate layers 122. For example, the gas channel C1 is coupled to the actuation and transfer component AT1, the gas channel C2 is coupled to the actuation and transfer component AT2, the gas channel C3 is coupled to the actuation and transfer component AT3, the gas channel C4 is coupled to the actuation and transfer component AT4, the gas channel C5 is coupled to the actuation and transfer component AT5, and the gas channel C6 is coupled to the actuation and transfer component AT6.

The system 100 further includes an actuator control 126, such as, for example, an optical demultiplexer and a light source, or a power controller. The actuator control is coupled to an actuator of each of the actuator and transfer components AT1 through AT6.

The one or more RF generators 104 generate corresponding one or more RF signals, e.g., pulsed RF signals, continuous waveform RF signals, etc., that are transferred via the corresponding one or more RF cables 108 to the corresponding inputs of the match 106. The match 106 matches an impedance of the load with that of the source to generate a modified RF signal at the output of the match 106. The modified RF signal is transferred via the RF transmission line 110 to the lower electrode of the chuck 114. Moreover, each gas line GL1 through GL6 transfers one or more process gases from the one or more gas cylinders via corresponding gas channels C1 through C6 to the corresponding actuator and transfer components AT1 through AT6. For example, the gas line GL1 transfers one or more process gases via the gas channel C1 to the actuator and transfer component AT1, the gas line GL2 transfers one or more process gases via the gas channel C2 to the actuator and transfer component AT2, and so on until the gas line GL6 transfers one or more process gases via the gas channel C6 to the actuator and transfer component AT6. It should be noted that a pressure of one or more process gases, in some embodiments, is sub atmospheric when the one or more process gases are hazardous.

Furthermore, the actuator control 126 controls the actuators of the actuator and transfer components AT1 through AT6 to allow a transfer of the one or more process gases from the corresponding gas channels C1 through C6 to the gap 128. When the modified RF signal is supplied to the lower electrode and the one or more process gases are supplied from the actuator and transfer components AT1 through AT6 to the gap 128, plasma is ignited within the plasma reactor 102 or is maintained within the plasma reactor 102 for processing the substrate supported on an upper surface of the chuck 114.

The upper electrode 124 has one or more openings, e.g., O1 through O6, etc., that extend vertically through the upper electrode 124. The opening O1 extends from the actuator and transfer component AT1 via the upper electrode 124 into the gap 128. Similarly, the opening O2 extends from the actuator and transfer component AT2 via the upper electrode 124 into the gap 128. The opening O3 extends from the actuator and transfer component AT3 via the upper electrode 124 into the gap 128, the opening O4 extends from the actuator and transfer component AT4 via the upper electrode 124 into the gap 128, the opening O5 extends from the actuator and transfer component AT5 via the upper electrode 124 into the gap 128, and the opening O6 extends from the actuator and transfer component AT6 via the upper electrode 124 into the gap 128. The openings O1 through O6 allow passage of the one or more process gases that are received from the actuator and transfer components AT1 through AT6 via the upper electrode 124 into the gap 128.

In some embodiments, the active showerhead 112 does not include the thermal layer 116. In various embodiments, the upper electrode 124 is located above the substrate layers 122 and between the substrate support layer 120 and the insulator layer 118 instead of being located below the substrate support layer 120.

In various embodiments, the channels C1 and C3 are coupled to each other via a valve and the valve is further coupled to a mixing channel, which couples to an actuation and transfer component.

In several embodiments, the substrate layers 122 are located on top of and adjacent to the thermal layer 116, and openings for transfer of one or more process gases extend from the actuator and transfer components AT1 through AT6 of the substrate layers 122 via the thermal layer 116, the insulator layer 118, the substrate support layer 120, and the upper electrode 124 into the gap 128. In these embodiments, the upper electrode 124 is adjacent to the substrate support layer 120.

In various embodiments, the substrate layers 122 and the substrate support layer 120 are located on top of the thermal layer 116. For example, the substrate support layer 120 is adjacent to and on top of the thermal layer 116 and the substrate layers 122 are on top of and adjacent to the substrate support layer 120. Openings for transfer of one or more process gases extend from the actuator and transfer components AT1 through AT6 via the substrate support layer 120, the thermal layer 116, the insulator layer 118, and the upper electrode 124 into the gap 128. The upper electrode 124 is adjacent to the insulator layer 118.

FIG. 1B is a diagram of an embodiment of a system 150 for injecting gas into a plasma reactor 152. The system 150 is the same as the system 100 (FIG. 1A) except that an active showerhead 153 includes an insulator coating 154, e.g., an alumina coating, a yttria coating, a ceramic coating, etc., under and adjacent to a bottom surface of the upper electrode 124. The insulator coating 154 is overlaid on the bottom surface of the upper electrode 124 to protect the upper electrode 124 from corrosive effects of the plasma and by-products, e.g., remnant materials, etc., of processing the substrate within the gap 128.

The openings O1 through O6 extend through the insulator coating 154, as illustrated in FIG. 1B to allow a passage of one or more process gases into the gap 128. The opening O1 extends from the actuator and transfer component AT1 via the upper electrode 124 and the insulator coating 154 into the gap 128. Similarly, the opening O2 extends from the actuator and transfer component AT2 via the upper electrode 124 and the insulator coating 154 into the gap 128, the opening O3 extends from the actuator and transfer component AT3 via the upper electrode 124 and the insulator coating 154 into the gap 128, the opening O4 extends from the actuator and transfer component AT4 via the upper electrode 124 and the insulator coating 154 into the gap 128, the opening O5 extends from the actuator and transfer component AT5 via the upper electrode 124 and the insulator coating 154 into the gap 128, and the opening O6 extends from the actuator and transfer component AT6 via the upper electrode 124 and the insulator coating 154 into the gap 128.

FIG. 1C is a diagram of an embodiment of a system 160 for illustrating a mixing chamber 162 between the upper electrode 124 and a showerhead plate 164. The system 160 is the same as the system 100 (FIG. 1A) except that an active showerhead 168 has the mixing chamber 162 and the showerhead plate 164. The mixing chamber 162 is located below the upper electrode 124 between the upper electrode 124 and the showerhead plate 164 and the showerhead plate 164 is located below the mixing chamber 162 between the mixing chamber 162 and the gap 128. The mixing chamber 162 is surrounded by a wall 170 of the active showerhead 168, the upper electrode 124, and the showerhead plate 164.

The opening O1 extends from the actuator and transfer component AT1 via the upper electrode 124 to a space within the mixing chamber 162. Similarly, the opening O2 extends from the actuator and transfer component AT2 via the upper electrode 124 to the space within the mixing chamber 162, the opening O3 extends from the actuator and transfer component AT3 via the upper electrode 124 to the space within the mixing chamber 162, the opening O4 extends from the actuator and transfer component AT4 via the upper electrode 124 to the space within the mixing chamber 162, the opening O5 extends from the actuator and transfer component AT5 via the upper electrode 124 to the space within the mixing chamber 162, and the opening O6 extends from the actuator and transfer component AT6 via the upper electrode 124 to the space within the mixing chamber 162.

The one or more process gases flow from the active and transfer components AT1 through AT6 into the mixing chamber 162 to be mixed with each other. The mix of the one or more process gases flows from the mixing chamber 162 into the gap 128 via multiple openings that extend vertically through the showerhead plate 164. In some embodiments, a number of the openings of the showerhead plate 164 are greater than a number of the openings of the active and transfer components AT1 through AT6. In various embodiments, a number of the openings of the showerhead plate 164 are equal to or less than a number of the openings of the active and transfer components AT1 through AT6.

It should be noted that in some embodiments, the mixing chamber 162 includes partitions, e.g., metal walls, etc., that allows mixing of one or more process gases received from two or more of the active and transfer components AT1 through AT6. For example, the mixing chamber 162 includes a vertical metal wall that mixes one or more process gases received from the active and transfer components AT2 through AT5 but does not allow the one or more process gases received from the active and transfer components AT1 and AT6 to be mixed with one or more process gases received from the from the active and transfer components AT2 through AT5. The vertical wall and the wall 170 mixes one or more process gases received from the active and transfer components AT1 and AT6. As another example, the mixing chamber 162 includes a vertical metal wall that mixes one or more process gases received from the active and transfer components AT3 and AT4 but does not allow the one or more process gases received from the active and transfer components AT1, AT2, AT5 and AT6 to be mixed with one or more process gases received from the from the active and transfer components AT3 and AT4. The vertical wall and the wall 170 mixes one or more process gases received from the active and transfer components AT1, AT2, AT5 and AT6.

In some embodiments instead of the one or more RF generators 104 and the match 106 being coupled to the chuck 130 and the upper electrode 124 being coupled to ground, the chuck 130 is coupled to ground and the one or more RF generators 104 and the match 106 are coupled to the upper electrode 124.

In various embodiments, one or more RF generators are coupled via a match to the upper electrode 124 in addition to the one or more RF generators 104 being coupled via the match 106 to the chuck 130.

FIG. 2A is a diagram of an embodiment of a system 200 for injecting gas into a plasma reactor 202, which is an inductively coupled plasma (ICP) reactor. The system 200 includes the one or more RF generators 104, the match 106, one or more RF generators 204, another match 206, and the plasma reactor 202. The one or more RF generators 204 are coupled to corresponding one or more inputs of the match 206 via corresponding one or more RF cables 208, and an output of the match 206 is coupled to an RF coil 212 of the plasma reactor 202 via an RF transmission line 210. Examples of the one or more RF generators 204 include the x MHz RF generator, or the y MHz RF generator, or the z MHz RF generator, or a combination of two or more of the x, y, and z MHz RF generators.

In some embodiments, in addition to the RF coil 212, one or more additional RF coils are used. For example, the one or more additional RF coils are coplanar with the RF coil 212, and are coupled to the match 206 or to another match, which is coupled to additional one or more RF generators (not shown).

The plasma reactor 202 includes an active showerhead 220, which includes the thermal layer 116, the insulator layer 118, the substrate layers 122, the RF coil 212, and a dielectric window 214. The RF coil 212 is located between the dielectric window 214 and substrate layers 122. The dielectric window 214 is located between the gap 128 and the RF coil 212. The gap 128 is formed between the dielectric window 214 and the chuck 130. The dielectric window 214 protects the RF coil 212 from receiving power reflected from the plasma formed within the gap 128. The dielectric window 214 has the openings O1 through O6.

Each of the one or more RF generators 204 is coupled to a corresponding input of the match 206 via a corresponding one of the one or more RF cables 208. An output of the match 206 is coupled to the RF transmission line 210. The match 206 includes the electric circuit components to match an impedance of a load coupled to the output of the match 206 with an impedance of a source coupled to the input of the match 206. For example, the match 206 matches an impedance of the plasma reactor 202 and the RF transmission line 210 coupled to the output of the match 206 with an impedance of the one or more RF generators 204 and the one or more RF cables 208. The match 206 reduces a probability of power being reflected a direction towards the source, e.g., from the load coupled to the output of the match 206 towards the source coupled to the inputs of the match 206.

The one or more RF generators 204 generate corresponding one or more RF signals that are transferred via the corresponding one or more RF cables 208 to the match 206. Upon receiving the RF signals from the one or more RF generators 204, the match 208 matches an impedance of the load coupled to the output of the match 208 with that of the source coupled to the one or more inputs of the match 206 to generate a modified RF signal. The modified RF signal is transferred via the RF transmission line 210 to the RF coil 212 for generating or maintaining plasma within the gap 128.

In some embodiments, the one or more RF generators 204 are referred to herein as one or more source RF generators. In these embodiments, the one or more RF generators 104 coupled to the chuck 130 are referred to as bias RF generators.

While the modified RF signals are supplied to the RF coil 212 and the chuck 130, and the actuator control 126 controls the actuators of the actuator and transfer components AT1 through AT6 to allow passage of one or more process gases via openings O7 through O12 into the gap 128, the plasma is generated or maintained within the gap 128. The opening O7 is formed within the actuator and transfer component AT1 and extends vertically through the dielectric window 214. Similarly, the opening O8 is formed within the actuator and transfer component AT2 and extends vertically through the dielectric window 214, the opening O9 is formed within the actuator and transfer component AT3 and extends vertically through the dielectric window 214, the opening O10 is formed within the actuator and transfer component AT4 and extends vertically through the dielectric window 214, the opening O11 is formed within the actuator and transfer component AT5 and extends vertically through the dielectric window 214, and the opening O12 is formed within the actuator and transfer component AT6 and extends vertically through the dielectric window 214.

In various embodiments, a Faraday shield is provided between the RF coil 212 and the dielectric window 214.

In several embodiments, the substrate layers 122 are located on top of and adjacent to the thermal layer 116, and openings for transfer of one or more process gases extend from the actuator and transfer components AT1 through AT6 via the thermal layer 116, the insulator layer 118, the substrate support layer 120, and the dielectric window 164 into the gap 128. In these embodiments, the RF coil 212 is adjacent to and below the substrate support layer 120.

In various embodiments, the substrate layers 122 and the substrate support layer 120 are located on top of the thermal layer 116. For example, the substrate support layer 120 is adjacent to and on top of the thermal layer 116 and the substrate layers 122 are on top of and adjacent to the substrate support layer 120. Openings for transfer of one or more process gases extend from the actuator and transfer components AT1 through AT6 via the substrate support layer 120, the thermal layer 116, the insulator layer 118, and the dielectric window 214 into the gap 128. In these embodiments, the RF coil 212 is adjacent to and below the insulator layer 118.

FIG. 2B is a diagram of an embodiment of a system 250 for illustrating mixing of one or more process gases within the mixing chamber 162 of a plasma reactor 254. The plasma reactor 254 is the same as the plasma reactor 202 (FIG. 2A) except that the plasma reactor 254 includes an active showerhead 260, which further includes the mixing chamber 162 and the showerhead plate 164. The actuator and transfer component AT1 has the opening O7 and the opening O7 extends through the dielectric window 214. Similarly, the actuator and transfer component AT2 has the opening O8 and the opening O8 extends through the dielectric window 214, the actuator and transfer component AT3 has the opening O9 and the opening O9 extends through the dielectric window 214, the actuator and transfer component AT4 has the opening O10 and the opening O10 extends through the dielectric window 214, the actuator and transfer component AT5 has the opening O11 and the opening O11 extends through the dielectric window 214, and the actuator and transfer component AT6 has the opening O12 and the opening O12 extends through the dielectric window 214.

The mixing chamber 162 is located below the dielectric window 214 and between the dielectric window 214 and the showerhead plate 164. The showerhead plate 164 is located below the mixing chamber 162 between the mixing chamber 162 and the gap 128. The mixing chamber 162 is surrounded by the wall 170 of the active showerhead 260, the dielectric window 214, and the showerhead plate 164.

While the modified RF signals are supplied to the RF coil 212 and to the chuck 130, the actuator control 126 controls the actuator and transfer components AT1 through AT6 so that one or more process gases transferred from the channels C1 through C6 to the actuator and transfer components AT1 through AT6 are further transferred from the actuator and transfer components AT1 through AT6 to the corresponding openings O7 through O12. For example, one or more process gases that are transferred from the channel C1 to the actuator and transfer component AT1 are further transferred from the actuator and transfer component AT1 to the opening O7. Similarly, one or more process gases that are transferred from the channel C2 to the actuator and transfer component AT2 are further transferred from the actuator and transfer component AT2 to the opening O8, one or more process gases that are transferred from the channel C3 to the actuator and transfer component AT3 are further transferred from the actuator and transfer component AT3 to the opening O9, one or more process gases that are transferred from the channel C4 to the actuator and transfer component AT4 are further transferred from the actuator and transfer component AT4 to the opening O10, one or more process gases that are transferred from the channel C5 to the actuator and transfer component AT5 are further transferred from the actuator and transfer component AT5 to the opening O11, and one or more process gases that are transferred from the channel C6 to the actuator and transfer component AT6 are further transferred from the actuator and transfer component AT6 to the opening O12.

One or more process gases are further transferred from the openings O7 through O12 of the corresponding actuator and transfer components AT1 through AT6 and of the dielectric window 214 into the mixing chamber 162 to be mixed with each other. The mix of the one or more process gases is transferred from the mixing chamber 162 into the gap 128 via the multiple openings that extend vertically through the showerhead plate 164.

FIG. 3 is a diagram to illustrate a supply of one or more process gases to an active showerhead 302 of a plasma reactor 300. The active showerhead 302 includes the substrate support layer 120 and the substrate layers 122. The substrate layers 122 are attached to the substrate support layer 120. The insulator coating 154, which is optional, is provided to the substrate layers 122. Gas lines for transferring one or more process gases are connected to a top surface of the substrate support layer 120 via a connector, e.g., a metal connector, a ceramic connector, etc., or via another mechanism, e.g., welding, etc.

One or more process gases are transferred via the gas lines, further via gas channels formed within the substrate support layer 120 and one or more layers of the substrate layers 122 to the openings O1 through O6 of the actuator and transfer components AT1 through AT6 (FIGS. 1A, 1B, 1C, 2A, and 2B).

Figure 4:
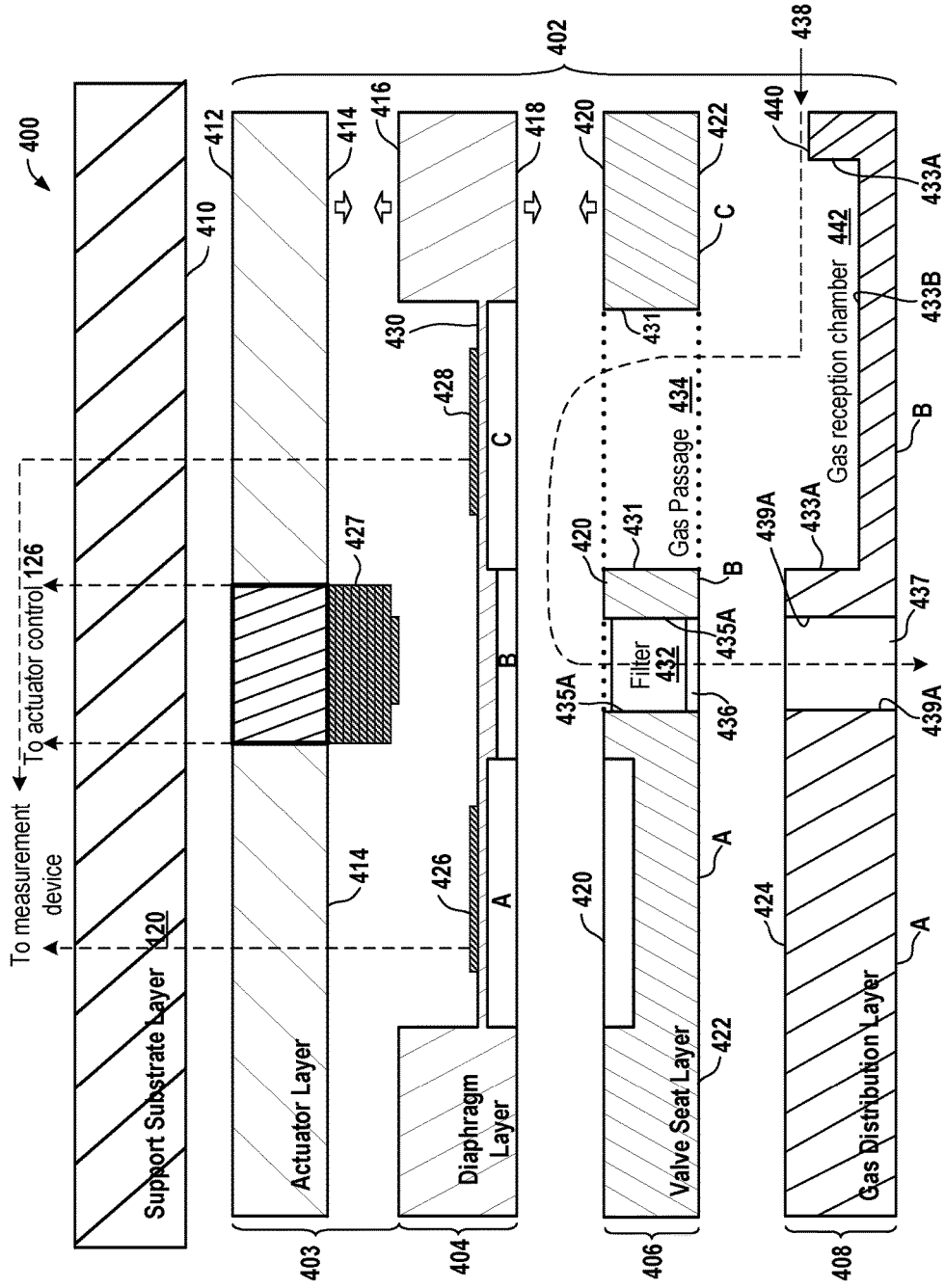
FIG. 4 is a diagram of an embodiment of an active showerhead.

FIG. 4 is a diagram of an embodiment of an active showerhead 400. The active showerhead 400 is an example of the active showerhead 112 of FIG. 1A, the active showerhead 153 of FIG. 1B, the active showerhead 168 of FIG. 1C, the active showerhead 220 of FIG. 2A, and the active showerhead 260 of FIG. 2B.

The active showerhead 400 includes the substrate support layer 120 and substrate layers 402. The substrate layers 402 are an example of the substrate layers 122 of FIGS. 1A, 1B, 1C, 2A, and 2B. The substrate layers 402 include an actuator layer 403, a diaphragm layer 404, a valve seat layer 406, and a gas distribution layer 408. The substrate support layer 120 is made of a metal, e.g., aluminum, alloy of aluminum, etc. Each of the actuator layer 403, the diaphragm layer 404, the valve seat layer 406, and the gas distribution layer 408 is made of a substrate, e.g., a semiconductor wafer, a silicon wafer, etc.

The actuator layer 403 is attached to the support substrate layer 120 and the actuator layer 403 and is located between the support substrate layer 120 and the diaphragm layer 404. Moreover, the diaphragm layer 404 is attached to the actuator layer 403 and the valve seat layer 406 and is located between the actuator layer 403 and the valve seat layer 406. Also, the valve seat layer 406 is located below the diaphragm layer 404 and above the gas distribution layer 408.

A bottom surface 410 of the substrate support layer 120 is attached to, e.g., clamped to, etc., a top layer 412 of the actuator layer 403. Moreover, a bottom surface 414 of the actuator layer 403 is attached to, e.g., clamped to, fastened to, bonded to, bonded using an adhesive to, bonded under a low temperature to, etc., a top surface 416 of the diaphragm layer 404. Also, a bottom surface 418 of the diaphragm layer 404 is attached to, e.g., bonded to, bonded using an adhesive to, fastened to, bonded under a high temperature to, etc., a top surface 420 of the valve seat layer 406. A bottom surface 422 of the valve seat layer 406 is attached to, e.g., bonded to, bonded using an adhesive to, fastened to, bonded under a high temperature to, etc., a top surface 424 of the gas distribution layer 408.

An actuator 427, e.g., a linear actuator, a piezoelectric actuator, a linear piezoelectric actuator, a motor driven actuator, a single layer of piezoelectric material, multiple layers of piezoelectric material, etc., is attached to, e.g., bonded to, clamped to, etc., the bottom surface 414 to be a part of the actuator layer 403. For example, the multiple layers of piezoelectric material are attached to each other to form the actuator 427. The actuator 427 is vertically aligned with a portion B of the diaphragm layer 404 to face the portion B of the diaphragm layer 404. Multiple strain sensors 426 and 428 are attached to, e.g., by using an adhesive, etc., a top surface 430 of the diaphragm layer 404. An example of a strain sensor includes a metal foil or a metal foil supported on and attached to an insulator. In this example, the insulator is attached to the top surface 430. It should be noted that the top surface 430 has a lower height than the top surface 416 of the diaphragm layer 404.

The strain sensor 426 measures a strain of a portion A of the bottom surface 418 of the diaphragm layer 404. Moreover, the strain sensor 428 measures a strain of a portion C of the bottom surface 418 of the diaphragm layer 404. The bottom surface 418 has the portion B that is located between the portions A and C. The portion B is aligned vertically with a valve seat of the valve seat layer 406. In some embodiments, the diaphragm layer 404 does not have the strain sensor 426 or the strain sensor 428 or both the strain sensors 426 and 428.

The valve seat layer 406 has a transfer channel 436, e.g., an orifice, in which a filter 432, which is optional, is fitted. The transfer channel 436 is formed by a vertical layer 435A of the valve seat layer 406. The transfer channel 436 is surrounded by the vertical layer 435A. The transfer channel 436 is formed between the portion B of the diaphragm layer 404 and a transfer channel 437 of the gas distribution layer 408. The valve seat layer 406 further includes a gas passage 434, which is a space formed within the valve seat layer 406. For example, the gas passage 434 is partially surrounded by and is formed by a vertical layer 431 of the valve seat layer 422. The gas passage 434 is formed between a portion B of the valve seat layer 406 and a portion C of the valve seat layer 406. The gas passage 434 is formed between the portion C of the diaphragm layer 404 and a gas reception chamber 442 formed within the gas distribution layer 408. The transfer channel 436 formed within the valve seat layer 406 is partially surrounded by a portion A of the valve seat layer 406 and the portion B of the valve seat layer 406.

The filter 432 located within the valve seat layer 406 and filters out particles that are generated by the valve seat layer 406. For example, the filter 432 is a porous membrane, e.g., a metal membrane, etc., that removes impurities within one or more process gases that flow through the filter 432. As another example, the filter 432 includes one or more layers of a porous membrane, e.g., a metal membrane. The impurities include the particles that are generated by the valve seat layer 406. In some embodiments, the valve seat layer 406 excludes the filter 432.

The transfer channel 437 of the gas distribution layer 408 is an orifice, which is aligned vertically with the transfer channel 436 of the valve seat layer 406. The transfer channel 437 is a space formed between a portion A of the gas distribution layer 408 and a portion B of the gas distribution layer 408. The transfer channel 437 is formed by and partially surrounded by a vertical layer 439A of the portions A and B of the gas distribution layer 408.

The gas distribution layer 408 includes a passage channel 438 at an edge of the gas distribution layer 408. The passage channel 438 is formed by fabricating a top surface 440 of the gas distribution layer 408 to be of a lower height than the top surface 424 of the gas distribution layer 424. The passage channel 438 allows passage of one or more process gases into a gas reception chamber 442 etched within the portion B of the gas distribution layer 408. The gas reception chamber 442 is a space formed within the portion B of the gas distribution layer 408. For example, the gas reception chamber 422 is etched within the gas distribution layer 408 and is partially surrounded by a vertical layer 433A of the gas distribution layer 408 and a horizontal layer 433B of the gas distribution layer 408. The gas reception chamber 422 is formed between the vertical layer 433A, the horizontal layer 433B, the gas passage 434, and the bottom surface 422 of the portion C of the valve seat layer 422.

The actuator 427 is coupled to a micro-actuator circuit, which is further described below. Moreover, each of the strain sensors 426 and 428 are coupled to a measurement device for measuring strain in each of the strain sensors 426 and 428. Examples of the measurement device include a voltage meter that measures an amount of voltage generated by the strain in each of the strain sensors 426 and 428 or a current meter that measures an amount of current generated by the strain in each of the strain sensors 426 and 428. The amount of voltage or the amount of current corresponds to, e.g., has a one-to-one relationship with, a mapping to, etc., an amount of strain in each of the strain sensors 426 and 428. The correspondence between the amount of voltage or the amount of current and the strain is stored in a memory device, e.g., a random access memory (RAM), a read-only memory (ROM), a volatile memory, a non-volatile memory, etc. Examples of the memory device include a Flash memory, a hard disk, etc. A processor of a host computer system coupled to the measurement device and the memory device determines the strain from the amount of current or the amount of voltage. As used herein, a processor is an application specific integrated circuit (ASIC), or a programmable logic device (PLD), or a microprocessor, or a microcontroller, or a central processing unit (CPU), and these terms are used interchangeably herein.

In some embodiments, an optical measurement device that has light sources that emit light towards the strain sensors 426 and 428 and photodetectors that detect light reflected from the strain sensors 426 and 428 is used as the measurement device. The photodetectors generates electrical signals indicating an amount of the light reflected from the strain sensors 426 and 428, which is used by the processor of the host computer system to determine the strain of each of the strain sensors 426 and 428.

It should be noted that in some embodiments, the passage channel 438, the gas reception chamber 442, the gas passage 434, the actuator 427, the portions A, B, and C of the diaphragm layer 404, the transfer channel 436, and the transfer channel 437 are portions of the actuator and transfer component AT1, or the actuator and transfer component AT2, or the actuator and transfer component AT3, or the actuator and transfer component AT4, or the actuator and transfer component AT5, or the actuator and transfer component AT6 (FIGS. 1A, 1B, 1C, 2A, and 2B).

Similarly, it should be noted that in various embodiments, the passage channel 438, the gas reception chamber 442, the gas passage 434, the actuator 427, the sensors 426 and 428, the portions A, B, and C of the diaphragm layer 404, the transfer channel 436, and the transfer channel 437 are portions of the actuator and transfer component AT1, or the actuator and transfer component AT2, or the actuator and transfer component AT3, or the actuator and transfer component AT4, or the actuator and transfer component AT5, or the actuator and transfer component AT6 (FIGS. 1A, 1B, 1C, 2A, and 2B).

It should further be noted that in various embodiments, the actuator 427, the portions A, B, and C of the diaphragm layer 404, a valve seat, and the transfer channel 436 are sometimes referred to herein as an actuator valve. The valve seat, in some embodiments, is the top surface 420 of the portion B of the valve seat layer 406 and a portion of the top surface 420 of the portion A of the valve seat layer 406 on which the portion B of the diaphragm layer 404 rests.

In various embodiments, instead of or in addition to the strain sensors 426 and 428, other types of sensors, e.g., flow rate sensors, temperature sensors, gas mass sensors, fluid density sensors, fluid mix ratio sensors, etc., are integrated in the diaphragm layer 404 in a similar manner, e.g., same manner, etc., in which the strain sensors 426 and 428 are integrated.

FIG. 5A is a diagram of an embodiment of the active showerhead 400 in which the support substrate layer 120, the actuator layer 403, the diaphragm layer 404, the valve seat layer 406, and the gas distribution layer 408 are attached to each other, and the actuator 427 is in a retracted position. The actuator control 126 controls the actuator 427 to be in the retracted position, which is a normally open position (NP). For example, when the actuator control 126 does not generate a signal to actuate the actuator 427, the actuator 427 is in the retracted position. One or more process gases flow via the passage channel 438 and the gas reception chamber 442 to the gas passage 434. The passage channel 438 is a portion of the channel C1, or C2, or C3, or C4, or C5, or C6 (FIGS. 1A, 1B, 1C, 2A, and 2B).

When the actuator 427 is in the retracted position, the one or more process gases in the gas passage 434 create a force that pushes the portion C of the diaphragm layer 404 in an up direction, e.g., towards the actuator layer 403. The push in the up direction also pushes the portions A and B of the diaphragm layer 404 in the up direction. This push indicates how each of the portions A, B, and C of the diaphragm layer 404 acts as a diaphragm, e.g., a flexible membrane. When the portion B of the diaphragm layer 404 is pushed up, a gap 501 is formed between the bottom surface 418 of the diaphragm layer 404 and the top surface 420 of the valve seat layer 406 to allow passage of the one or more process gases from the gas passage 434 via the transfer channels 436 and 437 into an opening 502 at an output of the transfer channel 437. In some embodiments, the transfer channel 437 is referred to herein as an exhaust orifice.

The impurities within the one or more process gases within the transfer channel 436 are filtered by the filter 432 and one or more process gases, which are filtered, flow into the transfer channel 437, which has the opening 502 that is a part of the opening O1, or O2, or O3, or O4, or O5, or O6, or O7, or O8, or O9, or O10, or O11, or O12 (FIGS. 1A, 1B, 1C, 2A, and 2B). For example, the opening 502 is an opening of the actual and transfer component AT1, or AT2, or AT3, or AT4, or AT5, or AT6, towards the gap 128 of any of the plasma reactors 102, 152, 166, 202, or 254 (FIGS. 1A, 1B, 1C, 2A, and 2B).

FIG. 5B is a diagram of an embodiment of the active showerhead 400 to illustrate that one or more process gases do not flow through the valve seat layer 406 and the gas distribution layer 437 to reach the opening 502. The actuator control 126 controls the actuator 427 to actuate to be in an extended position with respect to the bottom surface 414 of the actuator layer 403. For example, the actuator control 126 sends a signal to the actuator 427 so that the actuator 427 from the retracted position to the extended position. The extended position is extended with respect to the bottom surface 414 and is further down compared to the retracted position, illustrated above in FIG. 5A, of the actuator 427 and the retracted position is also with respect to the bottom surface 414.

The actuator 427 in the extended position presses against the diaphragm layer 404 to press the portion B of the diaphragm layer 404 against the top surface 420 of the valve seat layer 406 so that there is no gap between the top surface 420 and the portion B of the diaphragm layer 404 for passage of one or more process gases. When one or more process gases are received via the passage channel 438 into the gas reception chamber 442, the one or more process gases flow from the gas reception chamber 442 to the gas passage 434. However, the one or more process gases cannot flow from the gas passage 434 into the transfer channel 436 and further via the transfer channel 437 to the opening 502 due to the lack of gap between the top surface 420 of the valve seat layer 406 and the portion B of the diaphragm layer 404. It should be noted that a portion of the surface 420 of the valve seat layer 406 on which the portion B of the diaphragm layer 404 rests when there is no gap 501 is sometimes referred to herein as the valve seat of the valve seat layer 422. A force of the one or more process gases is not sufficient to push the portion C of the diaphragm layer 404 in the up direction to create the gap between the top surface 420 of the valve seat layer 406 and the portion B of the diaphragm layer 404.

In some embodiments, the channel C1 has a larger conductance than a conductance at the opening 502. The conductance at the opening 502 is the same as a conductance of the transfer channel 437.

FIG. 6A is a diagram of an embodiment of the active showerhead 400 to illustrate the actuator 427 that is in a normally closed (NC) position, which is an extended position. The actuator control 126 does not generate and provide a signal to the actuator 427. The actuator 427 is in the extended position with respect to the bottom surface 414 of the actuator layer 403 when the signal is not received from the actuator control 126. When the actuator 427 is in the extended position, the portion B of the diaphragm layer 404 rests against the top surface 420 of the valve seat layer 402 to block the gap between the portion B of the diaphragm layer 404 and the top surface 420, and so there is no flow of one or more process gases from the gas passage 434 of the valve seat layer 406 to the transfer channel 436 of the valve seat layer 406.

FIG. 6B is a diagram of an embodiment of the active showerhead 400 to illustrate the actuator 427 that is in an open position. The actuator control 126 controls the actuator 427 to retract with respect to the bottom surface 418 compared to the extended position in FIG. 6A. For example, the actuator control 126 sends a signal to the actuator 427 so that the actuator 427 retracts with respect to the bottom surface 414 of the actuator layer 403 and away from the diaphragm layer 414. The actuator 427 in the retracted position is further away from the diaphragm layer 414 compared to the actuator 427 in the extended position of FIG. 6A. When the actuator 427 is in the extended position of FIG. 6A, the actuator 427 is closer to the diaphragm layer 414 than when the actuator 427 is in the retracted position.

When the actuator 427 is in the retracted position, the gap 501 between the position B of the diaphragm layer 404 and the top surface 420 of the valve seat layer 406 is formed to allow passage of one or more process gases from the gas passage 434 via the gap 501 to the transfer channel 436 and further via the transfer channel 437 to the opening 502.

In some embodiments, instead of or in addition to the sensors 426 and 428 that measure strain, one or more sensors of other parameters, e.g., temperature within an active showerhead described herein, gas flow rate of one or more process gases flowing within the active showerhead, mass of one or more process gases flowing within the active showerhead, etc. are placed within one or more layers of substrate layers of the active showerhead.

Figure 7:
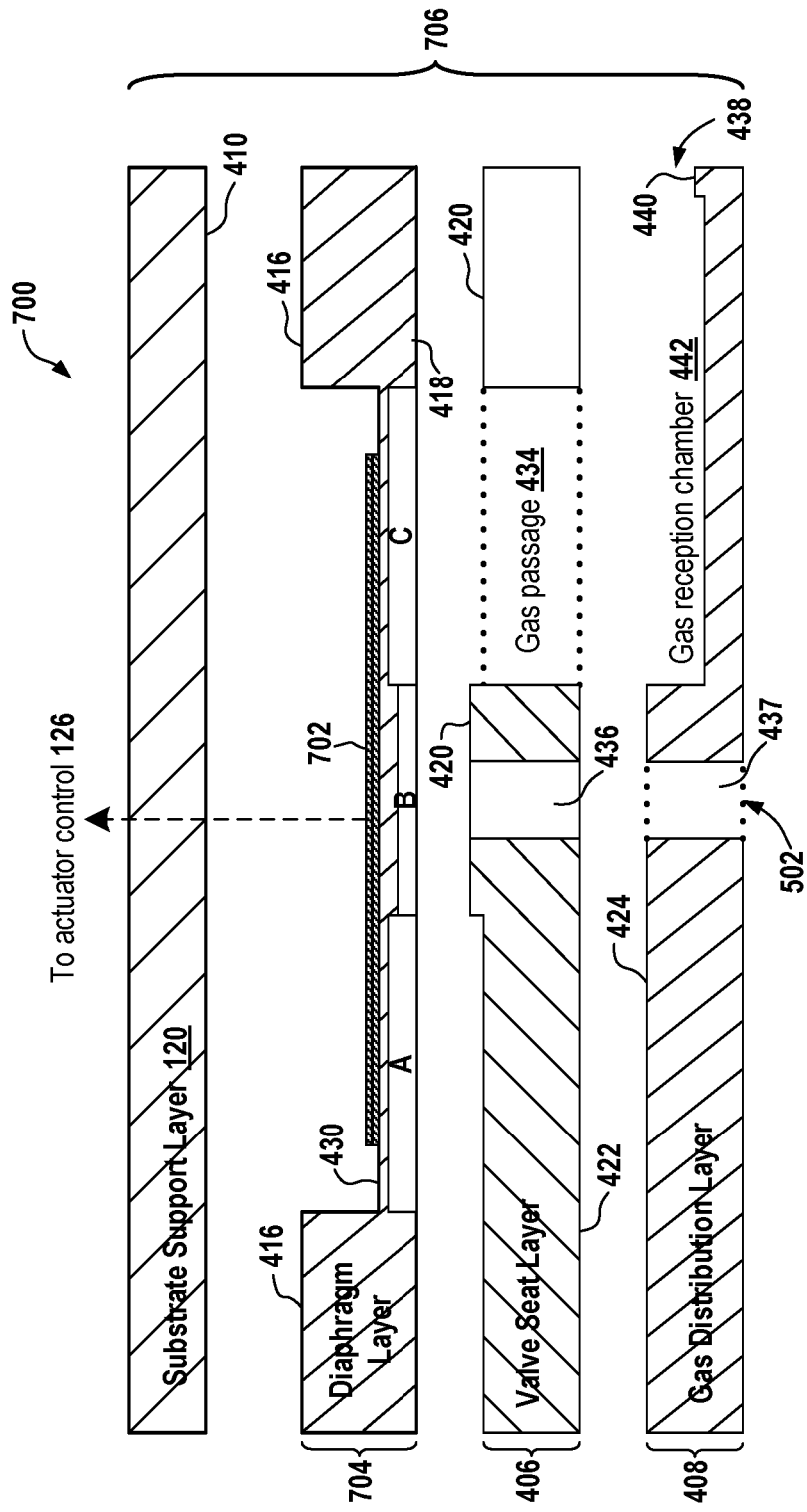
FIG. 7 is a diagram of an embodiment for illustrating an actuator that is a part of a diaphragm layer of the active showerhead.

FIG. 7 is a diagram of an embodiment of an active showerhead 700 to illustrate an actuator 702, e.g., a piezoelectric actuator, a piezoelectric monolayer, a shear stress actuator, etc., that is a part of a diaphragm layer 702. The active showerhead 700 includes the substrate support layer 120, the diaphragm layer 702, the valve seat layer 406, and the gas distribution layer 408. The diaphragm layer 702 is made of a substrate, e.g., a semiconductor wafer, a silicon wafer, etc.

The active showerhead 700 does not include the actuator layer 403 (FIG. 4) between the substrate support layer 120 and the diaphragm layer 704. The bottom surface 410 of the substrate support layer 120 is attached, e.g., bonded to, clamped to, adhered using an adhesive to, etc., to the top surface 416 of the diaphragm layer 704.

The diaphragm layer 702 is the same as the diaphragm layer 404 (FIGS. 5A, 5B, 6A, and 6B) except that the diaphragm layer 702 includes the actuator 702. Examples of the actuator 702 include a membrane, e.g., a metal membrane, a piezoelectric monolayer, etc., that is thinner than the diaphragm layer 702. The actuator 702 is attached, e.g., bonded, adhered to using an adhesive, etc., to the top surface 430 of the diaphragm layer 702. In some embodiments, the actuator 702 covers at least a part of the A portion of the diaphragm layer 704, the B portion of the diaphragm layer 704, and at least a part of the C portion of the diaphragm layer 704. For example, the actuator 702 has a wider diameter than the actuator 427.

The actuator 702 is controlled by the actuator control 126. The actuator control 126 provides a signal to the actuator 702 to change a curvature, e.g., bend the actuator 702, in a horizontal direction, of the actuator 702. When the actuator 702 is curved to be convex to be in a closed position, the portion B of the diaphragm layer 704 pushes towards the top surface 420 of the valve seat layer 406 to close the gap 501 between the portion B of the diaphragm layer 704 and the top surface 420 of the valve seat layer 406 to disallow passage of one or more process gases from the gas passage 434 of the valve seat layer 406 into the transfer channel 436.

Moreover, the actuator control 126 provides a signal to the actuator 702 to change the curvature of the actuator 702 to not bend the actuator 702. This is a normally open position of the actuator 702. For example, a signal is not sent from the actuator control 126 to the actuator 702. When the actuator 702 does not receive the signal, the actuator 702 is not bent in the horizontal direction to form the convex shape. When the actuator 702 is not bent, the gap 501 is formed between the portion B of the diaphragm layer 702 and the top surface 420 of the valve seat layer 406. The gap 501 is formed by the force of one or more process gases that are in the gas passage 434. When the gap 501 is formed, one or more process gases flow from the gas passage 434 to the transfer channel 436 and further via the transfer channel 437 to the opening 502 of the gas distribution layer 408.

It should be noted that in some embodiments, the passage channel 438, the gas reception chamber 442, the gas passage 434, the actuator 702, the portions A, B, and C of the diaphragm layer 704, the transfer channel 436, and the transfer channel 427 are portions of the actuator and transfer component AT1, or the actuator and transfer component AT2, or the actuator and transfer component AT3, or the actuator and transfer component AT4, or the actuator and transfer component AT5, or the actuator and transfer component AT6 (FIGS. 1A, 1B, 1C, 2A, and 2B).

It should further be noted that in various embodiments, the actuator 702, the portions A, B, and C of the diaphragm layer 704, the valve seat, and the transfer channel 436 are sometimes referred to herein as an actuator valve.

In various embodiments, an actuator, described herein, is situated remote from an active showerhead and a suitable fluid transfers an actuation pressure created by the actuator to the portion B of the diaphragm layer 404 to create or close the gap 501.

In some embodiments, the sensors 426 and 428 are attached to the top surface 430 of the diaphragm layer 704 in a manner similar to which the sensors 426 and 428 are attached to the top surface 430 of the diaphragm layer 404. For example, the sensor 426 is placed on some of the portion A of the diaphragm layer 704 and the sensor 428 is placed on some of the portion C of the diaphragm layer 704.

Figure 8A:
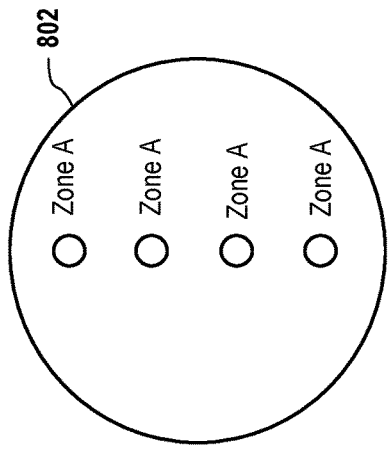
FIG. 8A is a top view of an embodiment of an arrangement of zones formed within the active showerhead.

FIG. 8A is a top view of an embodiment of an active showerhead 800 to illustrate an arrangement of zones A formed by the active showerhead 800. The zones A are arranged to be at four corners along a circumference of the active showerhead 810. The active showerhead 400 (FIGS. 4, 5A, 5B, 6A, and 6B) or the active showerhead 700 (FIG. 7) is an example of the active showerhead 800. An example of each zone A is a region at the opening 502 (FIGS. 5A, 5B, 6A, and 6B). The region receives one or more process gases as a result of operations of the actuator 427 (FIGS. 5A, 5B, 6A, and 6B), the portions A, B, and C of the diaphragm layer 404, the transfer channel 436, and the transfer channel 437 (FIGS. 4, 5A, 5B, 5C, and 5D). Another example of each zone A is a region that receives one or more process gases at the opening 502 due to operations of the actuator 427, the portions A, B, and C of the diaphragm layer 404, the sensors 426 and 428 (FIG. 4), the transfer channel 436, and the transfer channel 437. Yet another example of each zone A is a region that received one or more process gases at the opening 502 due to operations of the actuator 427, the portions A, B, and C of the diaphragm layer 404, the sensors 426 and 428, the filter 432, the transfer channel 436, and the transfer channel 437. Another example of each zone A is a region that receives one or more process gases at the opening 502 due to operations of the actuator 702 (FIG. 7), the portions A, B, and C of the diaphragm layer 404, the transfer channel 436, and the transfer channel 437. Another example of each zone A is a region that received one or more process gases at the opening 502 due to operations of the actuator 702, the portions A, B, and C of the diaphragm layer 404, the sensors 426 and 428 (FIG. 4), the transfer channel 436, and the transfer channel 437. Yet another example of each zone A is a region that receives one or more process gases at the opening 502 due to operations of the actuator 702, the portions A, B, and C of the diaphragm layer 404, the sensors 426 and 428, the filter 432, the transfer channel 436, and the transfer channel 437.

As an example, a first one of the zones A is a first region at the output O1 (FIGS. 1A, 1B, 1C, and 2B) or at the output O7 (FIG. 2A) that receives one or more process gases as a result of operations of a first actuator of the actuator layer 403 (FIGS. 5A, 5B, 6A, and 6B), a first set of portions, e.g., the portions A, B, and C, of the diaphragm layer 404, a first transfer channel, e.g., the transfer channel 436, of the valve seat layer 406, and a first transfer channel, e.g., the transfer channel 437, of the gas distribution layer 408 (FIGS. 4, 5A, 5B, 5C, and 5D). A second one of the zones A is a second region at the output O2 (FIGS. 1A, 1B, 1C, and 2B) or at the output O8 (FIG. 2A) that receives one or more process gases as a result of operations of a second actuator of the actuator layer 403, a second set of portions of the diaphragm layer 404, a second transfer channel of the valve seat layer 406, and a second transfer channel of the gas distribution layer 408 (FIGS. 4, 5A, 5B, 5C, and 5D). The actuator 427 (FIG. 4) is an example of each of the first and second actuators of the actuator layer 426. Moreover, the portions A, B, and C (FIG. 4) of the diaphragm layer 404 is an example of the portions of the first set of the portions or of the set of portions. Also, the transfer channel 436 (FIG. 4) is an example of each of first transfer channel of the valve seat layer 406 and the second transfer channel of the valve seat layer 406. The transfer channel 437 (FIG. 4) is an example of each of the first transfer channel of the gas distribution layer 408 and the second transfer channel of the gas distribution layer 408.

As an example, a first one of the zones A is a first region at the output O1 (FIGS. 1A, 1B, 1C, and 2B) or at the output O7 (FIG. 2A) that receives one or more process gases as a result of operations of a first actuator of the diaphragm layer 704 (FIG. 7A), a first set of portions of the diaphragm layer 704, a first transfer channel of the valve seat layer 406 (FIG. 7), and a first transfer channel of the gas distribution layer 408 (FIG. 7). A second one of the zones A is a second region at the output O2 (FIGS. 1A, 1B, 1C, and 2B) or at the output O8 (FIG. 2A) that receives one or more process gases as a result of operations of a second actuator of the diaphragm layer 704, a second set of portions of the diaphragm layer 704, a second transfer channel of the valve seat layer 406 (FIG. 7), and a second transfer channel of the gas distribution layer 408 (FIG. 7). The actuator 702 (FIG. 4) is an example of each of the first and second actuators of the diaphragm layer 704.

In some embodiments, a zone is formed where one or more process gases from multiple actuator and transfer components, e.g., AT1 and AT2, etc., are received, e.g., at multiple openings 502.

In various embodiments, a zone is formed by a single actuator and transfer component. In some embodiments, a zone is formed by multiple actuator and transfer components that are adjacent to each other.

Figure 8B:
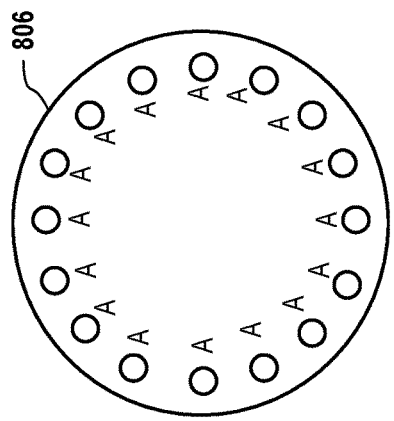
FIG. 8B is a top view of an embodiment of another arrangement of zones formed within the active showerhead.

FIG. 8B is a diagram of an embodiment of an active showerhead 802 in which the zones A are linearly aligned along a diameter of the active showerhead 802. The active showerhead 400 (FIGS. 4, 5A, 5B, 6A, and 6B) or the active showerhead 700 (FIG. 7) is an example of the active showerhead 802.

Figure 8C:
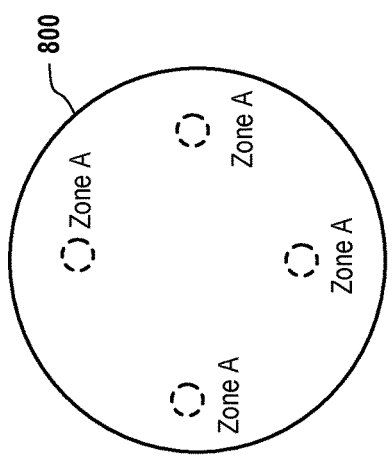
FIG. 8C is a top view of an embodiment of yet another arrangement of zones formed within the active showerhead.

FIG. 8C a diagram of an embodiment of an active showerhead 804 in which the zones A are formed in a triangular fashion along a circumference of the active showerhead 804. The active showerhead 400 (FIGS. 4, 5A, 5B, 6A, and 6B) or the active showerhead 700 (FIG. 7) is an example of the active showerhead 804.

Figure 8D:
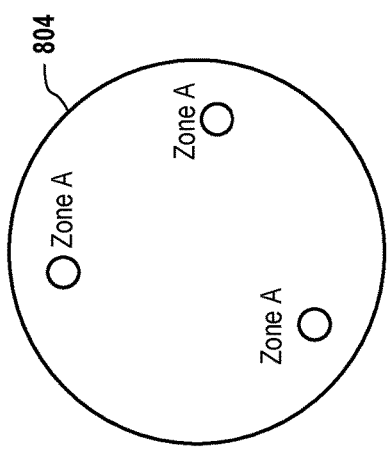
FIG. 8D is a top view of an embodiment of still another arrangement of zones formed within the active showerhead.

FIG. 8D is a diagram of an embodiment of an active showerhead 806 in which the zones A are located along a circumference of the active showerhead 806. The active showerhead 400 (FIGS. 4, 5A, 5B, 6A, and 6B) or the active showerhead 700 (FIG. 7) is an example of the active showerhead 806.

Figure 8E:
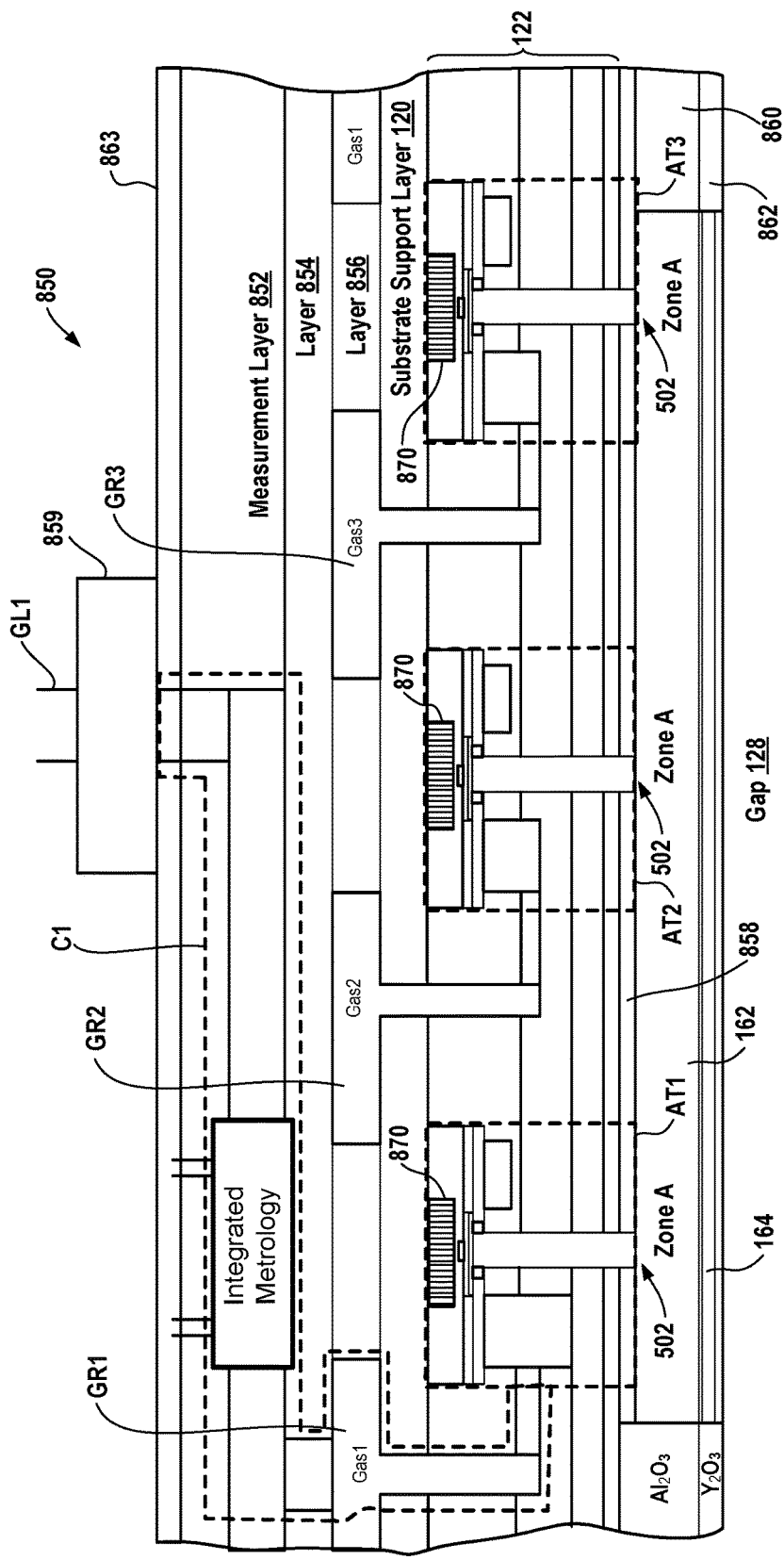
FIG. 8E is a diagram of an embodiment of an active showerhead to illustrate a transfer of one or more process gases to substrate layers.

FIG. 8E is a diagram of an embodiment of an active showerhead 850 to illustrate a transfer of one or more process gases to the substrate layers 122. The substrate layers 122 include multiple actuators, each of which is labeled 870. The actuator 427 (FIG. 4) or the actuator 702 (FIG. 7) is an example of actuator 870.

The active showerhead 850 includes a measurement layer 852, a layer 854, a gas reservoir layer 856, the substrate support layer 120, the substrate layers 122, an electrode layer 858, the mixing chamber 162, and the showerhead plate 164. An example of the measurement layer 852 is the thermal plate layer 116 (FIGS. 1C & 2B). Another example of the measurement layer 852 is a ceramic plate. An example of the layer 854 is the insulator layer 118 (FIGS. 1C & 2B).

Another example of the layer 854 is a wafer substrate that is etched to create a portion of the channel C1 for passage of one or more process gases. Yet another example of the layer 854 is a combination of the insulator layer 118 and the wafer substrate that is etched to create a portion of the channel C1 for passage of one or more process gases. In this example, the wafer substrate is attached to, e.g., bonded to, clamped to, etc., a bottom surface of the insulator layer 118 to be located between the insulator layer 118 and the gas reservoir layer 856. The mixing chamber 162 is surrounded on its sides by an insulator layer 860, e.g., an aluminum oxide ($Al_2O_3$) layer, a ceramic layer, etc., which is located below the substrate layers 122. The mixing chamber 162 is surrounded by the substrate layers 122, the insulator layer 860, and the showerhead plate 164. Also, another insulator layer, e.g., a yttrium oxide ($Y_2O_3$) layer, etc., is located below the insulator layer 862, and surrounds sides of the showerhead plate 164.

An example of the electrode layer 858 is the electrode 124 (FIG. 1C) or the RF coil 212 (FIG. 2B). In case the electrode layer 858 is the RF coil 212, the dielectric window 214 (FIG. 2B) is located below the electrode layer 858 and the mixing chamber 162.

The measurement layer 852 includes one or more metrology tools, e.g., a sensor that measures a pressure of one or more process gases in the channel C1, a sensor that measures a temperature of the one or more process gases in the channel C1, a sensor that measure a mass of the one or more process gases in the channel C1, a sensor that measures a flow rate of flow of the one or more process gases in the channel C1, a flow meter, etc. The gas reservoir layer 856 is made of a semiconductor material, e.g., silicon, a material that can be doped with impurities to alter its electronic properties, etc. As an example, the gas reservoir layer 856 is a wafer that is etched to include one or more gas reservoirs, e.g., a gas reservoir GR1. In some embodiments, a wafer is etched to create a gas reservoir, which is a space for storage of one or more process gases. In some embodiments, multiple gas reservoir layers are used to store a higher amount of gas than that stored in the gas reservoir layer 856.

The layer 854 is located below the measurement layer 852 and above the gas reservoir layer 856. The substrate support layer 120 is located below the gas reservoir layer 856 and above the substrate layers 122. A connector 859, e.g., a metal plate, a metal connector, etc., is used to connect the gas line GL1 with the channel C1. For example, the connector 859 is attached to, e.g., screwed to, bolted to, etc., a top surface 863 of the active showerhead 800. The top surface 119 (FIGS. 1C and 2B) is an example of the top surface 863.

The channel C1 extends through the measurement layer 852 and the layer 854 into the gas reservoir GR1. The channel C1 further extends from the gas reservoir GR1 via one or more layers of the substrate support layer 120 to the passage channel 438 (FIGS. 5A, 5B, 6A, 6B, 7).

The gas reservoir layer 856 includes additional gas reservoirs GR2 and GR3. As an example, the gas reservoir GR2 is a part of the gas channel C2 and the gas reservoir GR3 is a part of the gas channel C3. The channel C2 is isolated, e.g., separated, from the channel C3, the channel C1 is isolated from the channel C3, and the channel C1 is isolated from the channel C2. One or more process gases are received from the channel C2 (FIGS. 1C and 2B) and stored in the gas reservoir GR2 for further transfer to the actuation and transfer component AT2. Similarly, one or more process gases are received from the channel C3 (FIGS. 1C and 2B) and stored in the gas reservoir GR3 for further transfer to the actuation and transfer component AT3. The zone A is formed in the mixing chamber 162 below the actuation and transfer component AT1, another zone A is formed in the mixing chamber 162 below the actuation and transfer component AT2, and yet another zone A in the mixing chamber 162 is formed below the actuation and transfer component AT3. One or more process gases within the zones A are mixed with each other in the mixing chamber 162 before being transferred via the openings of the showerhead plate 164 into the gap 128.

Figure 9A:
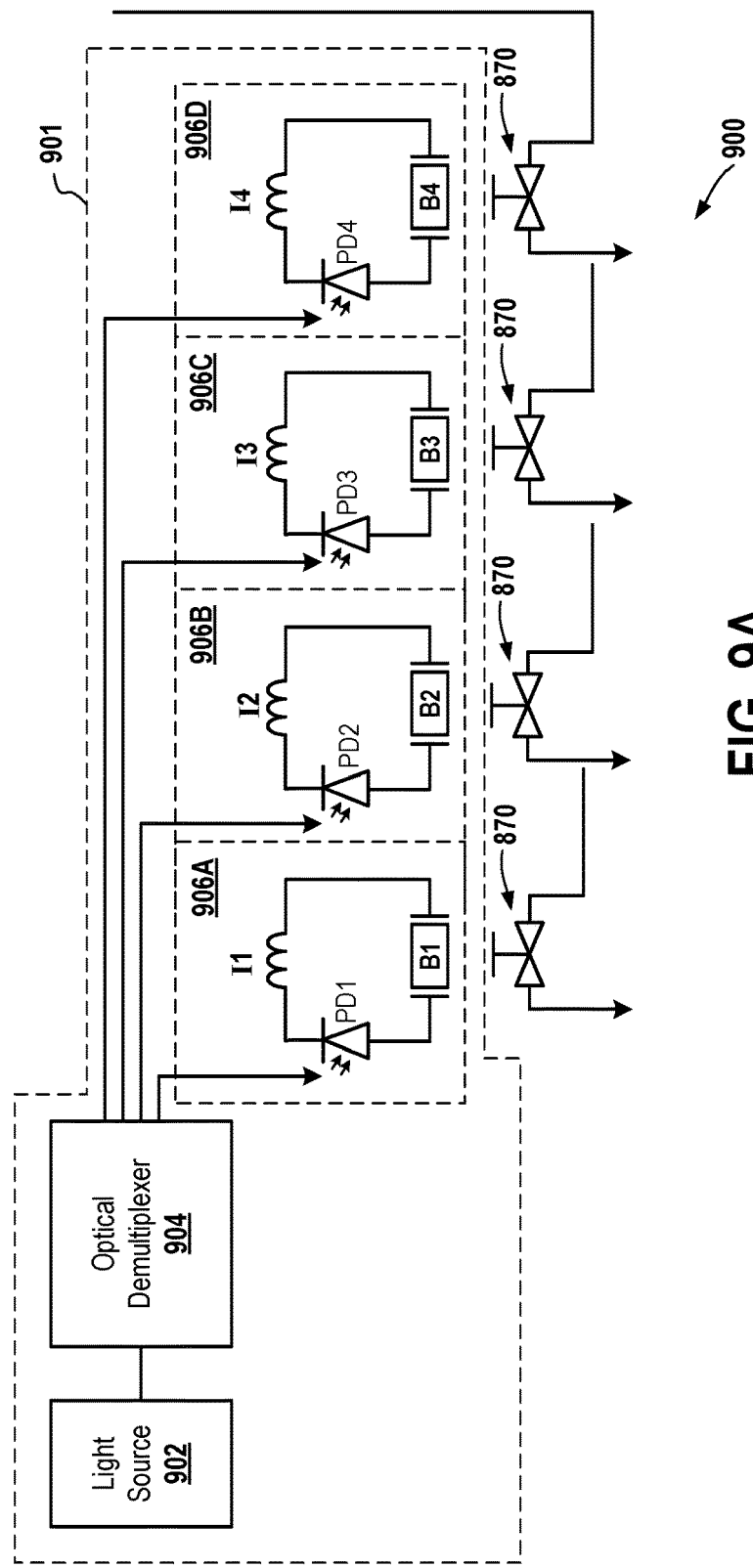
FIG. 9A is a diagram for illustrating an actuator control for controlling movement of an actuator.

FIG. 9A is a diagram of an embodiment of a system 900 to illustrate an actuator control 901, which is an example of the actuator control 126 (FIG. 1A). The system 900 includes the actuator control 901. The actuator control 901 includes a light source 902, an optical demultiplexer 904, and micro-actuator circuits 906A, 906B, 906C, and 906D. Examples of the light source 902 include a light generator, e.g., a light emitting diode, that generates light of multiple wavelengths. In some embodiments, the optical demultiplexer 904 includes a fiber optical network that distinguishes between the wavelengths and separates the wavelength such that each wavelength travels a different fiber optical cable to reach different photodiodes. The optical demultiplexer 904 further includes filters to distinguish between and filter in different wavelengths of light. Moreover, the optical demultiplexer 904 includes switching technologies, such as, MEMS systems, thermo-optical switches, etc., to allow switching of the wavelengths to different fiber optic cables.

The micro-actuator circuit 906A includes an inductor I1, a photodiode PD1, and a battery B1, which are all coupled in series with each other. Similarly, the micro-actuator circuit 906B includes an inductor I2, a photodiode PD2, and a battery B2, which are all coupled in series with each other. The micro-actuator circuit 906C includes an inductor I3, a photodiode PD3, and a battery B3, which are all coupled in series with each other. The micro-actuator circuit 906D includes an inductor I4, a photodiode PD4, and a battery B4, which are all coupled in series with each other. In some embodiments, instead of a battery within a micro-actuator circuit, a capacitor is used. In various embodiments, a micro-actuator circuit excludes a battery. The system 900 further includes actuators, each of which is labeled 870.

The light source 902 generates light that is directed towards the optical demultiplexer 904 via a communication medium, e.g., an optical fiber, at an input of the optical demultiplexer 904. The optical demultiplexer 904, e.g., the filters and the switching technologies, demultiplexes, e.g., splits, etc., the light into multiple lights and each of the multiple lights have a different wavelength.

The light of a first one of the wavelengths is directed via a first optical fiber coupled to an output of the optical demultiplexer 904 towards the photodiode PD1. Similarly, the light of a second one of the wavelengths is directed via a second optical fiber coupled to another output of the optical demultiplexer 904 towards the photodiode PD2. Moreover, the light of a third one of the wavelengths is directed via a third optical fiber coupled to yet another output of the optical demultiplexer 904 towards the photodiode PD3 and the light of a fourth one of the wavelengths is directed via a fourth optical fiber coupled to another output of the optical demultiplexer 904 towards the photodiode PD4.

The light of the first wavelength is detected by the photodiode PD1 to generate an electrical signal. Similarly, the light of the second wavelength is detected by the photodiode PD2 to generate an electrical signal, the light of the third wavelength is detected by the photodiode PD3 to generate an electrical signal, and the light of the fourth wavelength is detected by the photodiode PD4 to generate an electrical signal.

The electrical signal generated by the photodiode PD1 passes via the inductor I1 to change an impedance of the electrical signal and the electrical signal with the changed impedance creates a charge, which is stored in the battery B1. Similarly, the electrical signal generated by the photodiode PD2 passes via the inductor I2 to change an impedance of the electrical signal and the electrical signal with the changed impedance creates a charge, which is stored in the battery B2. Moreover, the electrical signal generated by the photodiode PD3 passes via the inductor I3 to change an impedance of the electrical signal and the electrical signal with the changed impedance creates a charge, which is stored in the battery B3. Also, the electrical signal generated by the photodiode PD4 passes via the inductor I4 to change an impedance of the electrical signal and the electrical signal with the changed impedance creates a charge, which is stored in the battery B4.

The electrical signal with the changed impedance in the micro-actuator circuit 906A generates an electromagnetic field that passes through the actuator 870. When the electromagnetic field passes through the actuator 870, the actuator 870 extends or retracts, or both extends and retracts. Similarly, the electrical signal with the changed impedance in the micro-actuator circuit 906B generates an electromagnetic field that passes through the actuator 870 to extend or retract or extend and retract the actuator 870. When the light source 902 is not active, e.g., turned off, is nonoperational, is malfunctioning, etc., charge stored within a battery is used to generate the electromagnetic field to control motion of the actuator 870.

In some embodiments, instead of four photodiodes, any other number of photodiodes are used and the number of photodiodes matches a number of the actuators 870.

In various embodiments, a micro-actuator circuit does not include any inductor and a photodiode of the micro-actuator circuit is connected to a battery of the micro-actuator circuit.

In several embodiments, a micro-actuator circuit does not include any inductor and does not include any photodiode. In these embodiments, the micro-actuator circuit includes a battery and a positive terminal of the battery is coupled to a negative terminal of the battery to generate an electrical signal.

Figure 9B:
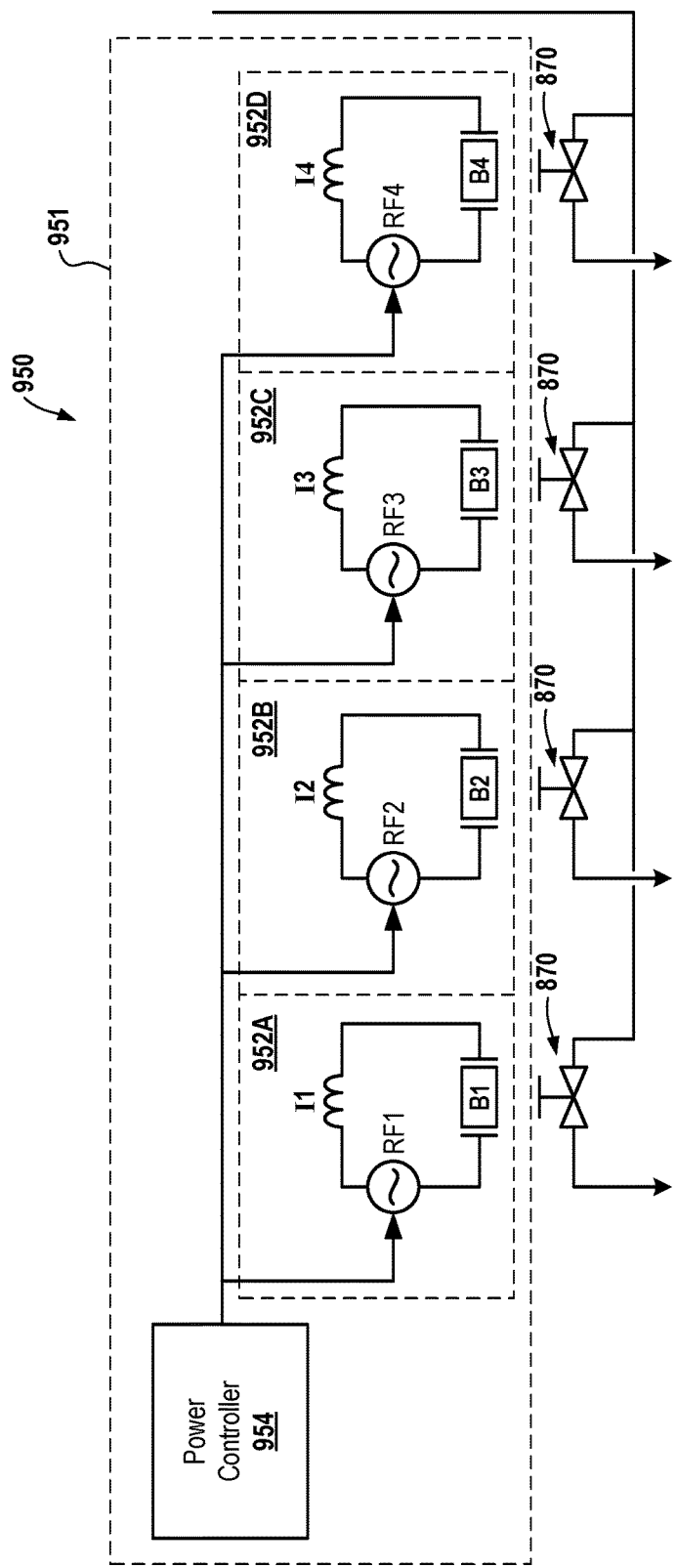
FIG. 9B is a diagram for illustrating another actuator control for controlling movement of an actuator.

FIG. 9B is a diagram of an embodiment of a system 950 to illustrate an actuator control 951 for actuating one or more actuators 870. The actuator control 951 is another example of the actuator control 126 (FIG. 1A). The system 950 includes the actuator control 951 and the actuators 870. The actuator control 951 includes a power controller 954 and micro-actuator circuits 952A, 952B, 952C, and 952D. Examples of the power controller 954 include a processor coupled to a driver, e.g., one of more transistors.

The micro-actuator circuit 952A includes the inductor I1, an RF power supply RF1, and the battery B1, which are all coupled in series with each other. Similarly, the micro-actuator circuit 952B includes the inductor I2, an RF power supply RF2, and the battery B2, which are all coupled in series with each other. Also, the micro-actuator circuit 952C includes the inductor I3, an RF power supply RF3, and the battery B3, which are all coupled in series with each other. The micro-actuator circuit 952D includes the inductor I4, an RF power supply RF4, and the battery B4, which are all coupled in series with each other.

The processor of the power controller 954 generates a command signal to provide to the driver of the power controller 954. The driver of the power controller 954 upon receiving the command signal generates a drive current signal to provide to the RF power supplies RF1 through RF4. Upon receiving the drive current signal, the RF power supplies RF1 through RF4 generate corresponding RF signals.

The RF signal generated by the RF power supply RF1 passes via the inductor I1 to change an impedance of the RF signal. The RF signal with the changed impedance creates a charge that is stored in the battery B1 and the RF signal controls extension or retraction of the actuator 870 in a manner described above with reference to FIG. 9A. Similarly, the RF signal generated by the RF power supply RF2 passes via the inductor I2 to change an impedance of the RF signal. The RF signal with the changed impedance creates a charge that is stored is stored in the battery B2 and the RF signal controls extension or retraction of the actuator 870 in a manner described above with reference to FIG. 9A.

In various embodiments, a micro-actuator circuit does not include any inductor and an RF power supply of the micro-actuator circuit is connected to a battery of the micro-actuator circuit.

In several embodiments, a micro-actuator circuit does not include any inductor and does not include any RF power supply. In these embodiments, the micro-actuator circuit includes a battery and a positive terminal of the battery is coupled to a negative terminal of the battery to generate an electrical signal.

In some embodiments, an inductor of a micro-actuator circuit is coupled to a motor that is further coupled via a driver, e.g., one or more transistors, to a processor, e.g., the processor of the host computer system. The processor of the host computer system provides a frequency of operation and a power of operation of an RF generator, described herein, to the RF generator. The processor generates an instruction signal to provide to the driver. Upon receiving the instruction signal, the driver generates a current signal and sends the current signal to the motor. The motor, in response to the current signal, rotates to change an inductance of the inductor of the micro-actuator circuit, e.g., by moving a core of the inductor, etc. The change in the inductance changes an impedance of the electrical signal generated by a photodiode or an RF power supply of the micro-actuator circuit to control an amount by which the actuator 870 retracts or extends.

Figure 10:
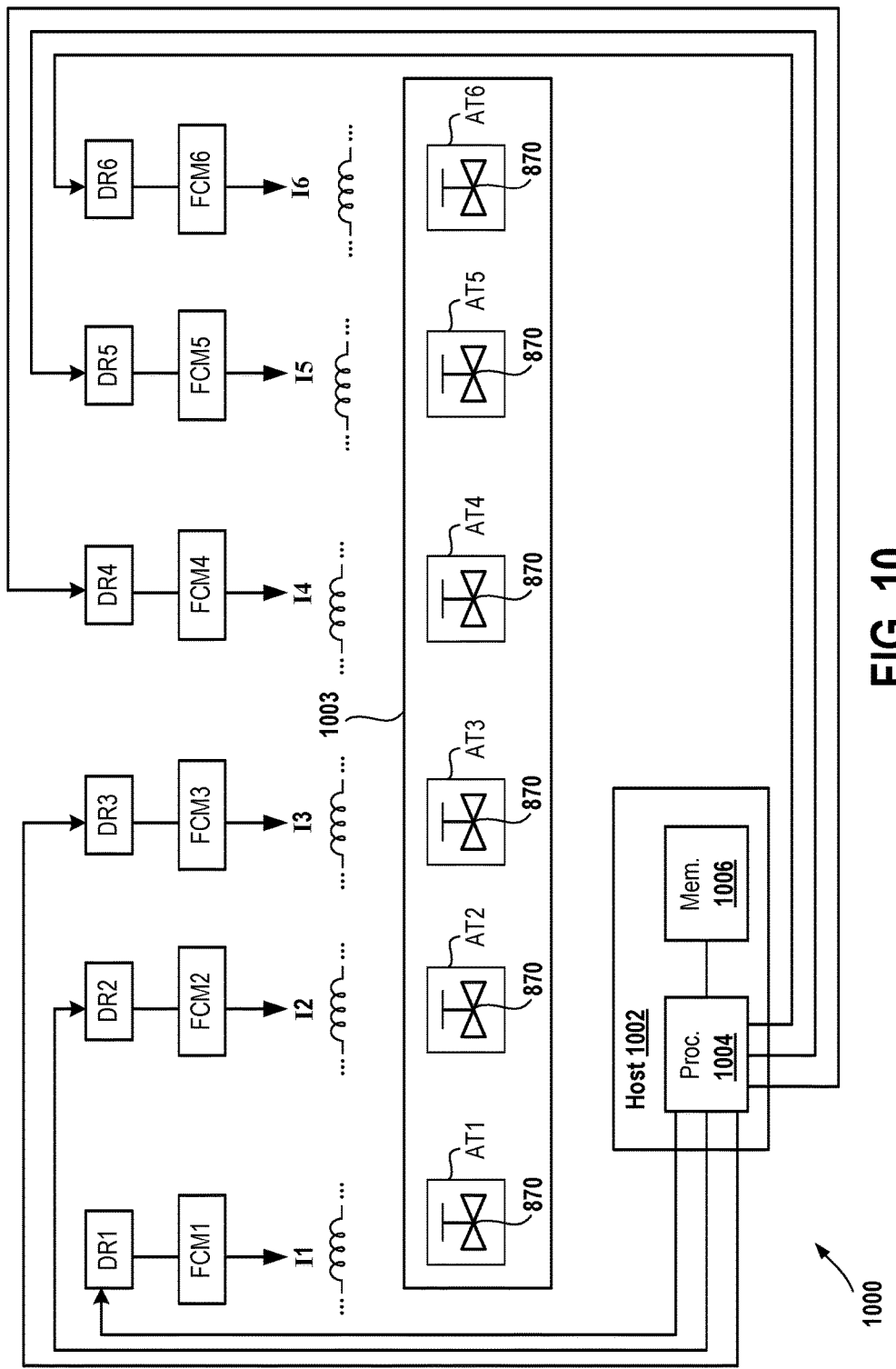
FIG. 10 is a diagram of an embodiment illustrating gas wave injection and dose control.

FIG. 10 is a diagram of an embodiment of a system 1000 to illustrate gas wave injection and dose control. The system 1000 includes a host computer system 1002, an active showerhead 1003, and multiple drivers DR1, DR2, DR3, DR4, DR5, and DR6. Each of the active showerhead 112 (FIG. 1A), 153 (FIG. 1B), 168 (FIG. 1C), 220 (FIG. 2A), 260 (FIG. 2B), 302 (FIG. 3), 400 (FIG. 4), 700 (FIG. 7), and 850 (FIG. 8E) is an example of the active showerhead 1003. An example of each of the drivers DR1 through DR6 includes one or more transistors. Moreover, the system 1000 includes multiple flow control mechanisms FCM1, FCM2, FCM3, FCM4, FCM5, and FCM6. An example of a flow control mechanism includes a motor. Another example of the flow control mechanism includes a circuit, e.g., a current generator, etc., for generating an electromagnetic field. Each driver is coupled to a corresponding flow control mechanism. For example, the driver DR1 is coupled to the flow control mechanism FCM1, and so on until the driver DR6 is coupled to the flow control mechanism FCM6.

Each flow control mechanism is coupled to a corresponding inductor I1, I2, I3, I4, I5, and I6. For example, the flow control mechanism FCM1 is coupled via a connection mechanism, e.g., one or more rods, a combination of one or more gears and one or more rods, etc., to the inductor I1 and so on until the flow control mechanism FCM6 is coupled via a connection mechanism to the inductor I6. It should be noted that the inductors I5 and I6 are inductors of corresponding micro-actuator circuits, e.g., a micro-actuator circuit having the same structure as that of the micro-actuator circuit 906A (FIG. 9A), a micro-actuator circuit having the same structure as that of the micro-actuator circuit 952A (FIG. 9B), etc.

The host computer system 1002 includes a processor 1004 and a memory device 1006. The processor 1004 is coupled to the memory device 1006 and to the drivers DR1 through DR6.

In a gas wave injection mode, the processor 1004 sends an activate instruction to the drivers DR3 and DR4 to generate current signals. Upon receiving the activate instruction, the current signals are generated by the drivers DR3 and DR4 and supplied to the corresponding flow control mechanisms FCM3 and FCM4. The flow control mechanisms FCM3 and FCM4 operate to change an inductance of the corresponding inductors I3 and I4 to allow passage of one or more process gases via the corresponding gaps 501 (FIG. 5A) of the corresponding actuator and transfer components AT3 and AT4. It should be noted that a change in an inductance of an inductor of a micro-actuator circuit changes an amount of current flowing through the micro-actuator circuit, which changes an amount of electromagnetic field generated by the amount of current. The change in the amount of the electromagnetic field changes an amount by which an actuator of an actuator and transfer component moves to open or close the gap 501. After sending the activate instruction, the processor 1004 sends a deactivate instruction to the drivers DR3 and DR4 to stop generating the current signals. The current signals not supplied to the corresponding flow control mechanisms FCM3 and FCM4 by the drivers DR3 and DR4. The flow control mechanisms FCM3 and FCM4 operate to change an inductance of the corresponding inductors I3 and I4 to disallow passage of one or more process gases via the corresponding gaps 501 (FIG. 5A) of the corresponding actuator and transfer components AT3 and AT4.

After sending the deactivate instruction to the drivers DR3 and DR4, the processor sends an activate instruction to the drivers DR2 and DR5 to generate current signals. Upon receiving the deactivate instruction, current signals are generated and supplied to the corresponding flow control mechanisms FCM2 and FCM5 by the drivers DR2 and DR5. The flow control mechanisms FCM2 and FCM5 operate to change an inductance of the corresponding inductors I2 and I5 to allow passage of one or more process gases via the corresponding gaps 501 of the corresponding actuator and transfer components AT2 and AT5. After sending the activate instruction to the drivers DR3 and DR4, the processor sends a deactivate instruction to the drivers DR2 and DR5 to stop generating current signals. Upon receiving the deactivate instruction, the current signals are not supplied to the corresponding flow control mechanisms FCM2 and FCM5 by the drivers DR2 and DR5. The flow control mechanisms FCM2 and FCM5 operate to change an inductance of the corresponding inductors I2 and I5 to disallow passage of one or more process gases via the corresponding gaps 501 of the corresponding actuator and transfer components AT2 and AT5.

Furthermore, after sending the deactivate instruction to the drivers DR2 and DR5, the processor sends an activate instruction to the drivers DR1 and DR6 to generate current signals. Upon receiving the activate instruction, the current signals are generated and supplied to the corresponding flow control mechanisms FCM1 and FCM6 by the drivers DR1 and DR6. The flow control mechanisms FCM1 and FCM6 operate to change an inductance of the corresponding inductors I1 and I6 to allow passage of one or more process gases via the corresponding gaps 501 of the corresponding actuator and transfer components AT1 and AT6. After sending the activate instruction to the drivers DR1 and DR6, the processor sends a deactivate instruction to the drivers DR1 and DR6 to stop generating current signals. Upon receiving the deactivate instruction, the current signals not supplied to the corresponding flow control mechanisms FCM1 and FCM6 by the drivers DR1 and DR6. The flow control mechanisms FCM1 and FCM6 operate to change an inductance of the corresponding inductors I1 and I6 to disallow passage of one or more process gases via the corresponding gaps 501 of the corresponding actuator and transfer components AT1 and AT6. After sending the deactivate instruction to the drivers DR1 and DR6, the processor sends an activate instruction to the drivers DR3 and DR4 to generate current signals. In this manner, one or more process gases are repeatedly supplied from a center of the active showerhead 1003 to an edge of the active showerhead 1003.

In various embodiments, one or more process gases are supplied from the edge of the active showerhead 1003 to the center of the active showerhead 1003 in a manner opposite to that described above. For example, the processor 1004 sends an activate instruction to the drivers DR1 and DR6 to generate current signals followed by a deactivate instruction. After sending the deactivate instruction to the drivers DR1 and DR6, the processor 1004 sends an activate instruction to the drivers DR2 and DR5 to generate current signals followed by a deactivate instruction. Similarly, after sending the deactivate instruction to the drivers DR2 and DR5, the processor 1004 sends an activate instruction to the drivers DR3 and DR4 to generate current signals. The processor 1004 then sends a deactivate instruction to the drivers DR3 and DR4. The processor 1004 then repeats this cycle of activation and deactivation by resending an activate instruction to the drivers DR1 and DR6.

In various embodiments, there is an overlap between sending the activate instruction to activate the actuator and transfer components AT2 and AT5 to allow passage of one or more process gases via the corresponding gaps 501 of the actuator and transfer components AT2 and AT5 and sending the deactivate instruction to deactivate the actuator and transfer components AT3 and AT4 to disallow passage of one or more process gases via the corresponding gaps 501 of the actuator and transfer components AT3 and AT4. For example, the activate instruction to activate the actuator and transfer components AT2 and AT5 is sent a pre-determined period of time before sending the deactivate instruction to deactivate the actuator and transfer components AT3 and AT4.

In some embodiments, one or more process gases are transferred from the actuator and transfer components AT1 through AT6 towards the gap 128 (FIG. 1A) in any order. For example, the processor 1004 sends an activate instruction to the drivers DR1 through DR6 to generate current signals in a random order or a pseudo-random order to activate the actuator and transfer components AT1 through AT6 in the random order or the pseudo-random order. As another example, the processor 1004 sends a deactivate instruction to the drivers DR1 through DR6 to stop generating current signals in a random order or a pseudo-random order to deactivate the actuator and transfer components AT1 through AT6 in the random order or the pseudo-random order.

In a dose control mode, each of the actuators 870 is precisely controlled to open or close until a pre-specified level. For example, one or more of the actuators 870 is not completely open or completely closed but is rather closed to achieve the pre-specified level. For example, the actuator 427 is extend half-way from the top surface 430 (FIG. 4) of the diaphragm layer 404 (FIG. 5A) towards the top surface 420 of the valve seat layer 406 (FIG. 5A). As another example, the processor 1004 sends an instruction to the drivers DR3 and DR4 to generate current signals having pre-specified amounts of current. The current signals are generated and supplied to the corresponding flow control mechanisms FCM3 and FCM4 by the drivers DR3 and DR4. The flow control mechanisms FCM3 and FCM4 operate to change an inductance of the corresponding inductors I3 and I4 to pre-specified levels based on the pre-specified amounts of current to control movement of the corresponding actuators 870 of the corresponding actuator and transfer components AT3 and AT4 to control an amount of the gaps 501 of the corresponding actuator and transfer components AT3 and AT4 to allow passage of one or more process gases at pre-determined flow rates via the corresponding gaps 501. Moreover, after a pre-determined time period after sending the instruction, the processor 1004 sends another instruction to the drivers DR3 and DR4 to stop generating the current signals. When the drivers DR3 and DR4 do not generate the current signals, the FCM3 and FCM4 operate to change inductances of the corresponding inductors I3 and I4 so that the gap 501 is completely open. As yet another example, the processor 1004 sends an instruction to the drivers DR3 and DR4 to generate current signals. The current signals are generated and supplied to the corresponding flow control mechanisms FCM3 and FCM4 by the drivers DR3 and DR4. The FCM3 and FCM4 operate to change inductances of the inductors I3 and I4 to control movement of the corresponding actuators 870 of the corresponding actuator and transfer components AT3 and AT4 to close the gaps 501 to disallow passage of one or more process gases via the gaps 501 of the corresponding actuator and transfer components AT3 and AT4. Moreover, after the pre-determined time period after sending the instruction, the processor 1004 sends another instruction to the drivers DR3 and DR4 to the current signals having pre-specified amounts. When the drivers DR3 and DR4 generate the current signals having the pre-specified amounts, the FCM3 and FCM4 operate to change inductances of the corresponding inductors I3 and I4 to control movement of the corresponding actuators 870 of the corresponding actuator and transfer components AT3 and AT4 to open the gaps 501 of the actuator and transfer components AT3 and AT4 by the pre-specified levels. The opening of the gaps 501 at the pre-specified levels allows passage of one or more process gases via the gaps 501 at the pre-determined flow rates. Such opening and closing of the gap 501 of the actuator and transfer components AT3 and AT4, in some embodiments, is repeated multiple times in the dose control mode.

In some embodiments, the dose control mode is manipulated to achieve a virtual steady state flow of one or more process gases in which the gaps 501 of the actuator and transfer components AT1 through AT6 are controlled to supply the one or more process gases at the outputs 501 of the actuator and transfer components AT1 through AT6 in the same or varying doses to achieve the steady state flow of the one or more process gases across the zones A of the actuator and transfer components AT1 through AT6.

In several embodiments, the virtual steady state flow is achieved to reduce nonuniformity in a plasma process, e.g., etching a wafer, depositing materials on the wafer, cleaning the wafer, etc. In various embodiments, the control of the supply of the one or more process gases at the outputs 501 of the actuator and transfer components AT1 through AT6 helps achieve a skew in process chemistry distribution to improve process results.

In some embodiments, the measurement device, described above with reference to FIG. 4, is coupled to the processor 1004 of the host computer system 1002, which is coupled via the corresponding drivers DR1 through DR6 and the corresponding flow valve control mechanisms FCM1 through FCM6 to the corresponding inductors I1 through I6. The processor 1004 determines based on the strain corresponding flow rates of one or more process gases flowing via the gaps 501 of the actuator and transfer components AT1 through AT6 to be achieved. The processor 1004 sends command signals to the corresponding drivers DR1 through DR6 based on the corresponding flow rates to be achieved. The drivers DR1 through DR6 generate corresponding current signals having corresponding amounts of current upon receiving the command signals. The flow valve control mechanisms FCM1 through FCM6 operate, e.g., the motor rotates or the circuit generates a current, etc., upon receiving the corresponding current signals to change inductances of the corresponding inductors I1 through I6 to further control the actuators 870 to further change an amount of the gaps 501 to achieve the corresponding flow rates of one or more process gases through the corresponding gaps 501 of the actuator and transfer components AT1 through AT6.

In various embodiments, the one or more metrology tools, described above with reference to FIG. 8E, are coupled to the processor 1004. The processor 1004 determines based on one or more of the parameters, e.g., pressure of one or more process gases in the channels C1 through C6, temperature of the one or more process gases, types of the one or more process gases, etc., corresponding flow rates of the one or more process gases flowing via the gaps 501 of the actuator and transfer components AT1 through AT6 to be achieved. The processor 1004 sends command signals to the corresponding drivers DR1 through DR6 based on the corresponding flow rates to be achieved. The drivers DR1 through DR6 generate corresponding current signals having corresponding amounts of current upon receiving the command signals. The flow valve control mechanisms FCM1 through FCM6 operate, e.g., the motor rotates or the circuit generates a current, etc., upon receiving the corresponding current signals to change inductances of the corresponding inductors I1 through I6 to further control the actuators 870 to further change an amount of the gaps 501 to achieve the corresponding flow rates of one or more process gases through the corresponding gaps 501 of the actuator and transfer components AT1 through AT6.

It should be noted that although some of the embodiments are described above using MEMS valves, in several embodiments, other types of valves, which are not MEMS valves, are used.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller, described herein, is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, a plasma-enhanced chemical vapor deposition (PECVD) chamber or module, a clean type chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A system for semiconductor processing, comprising:
an actuator control;
a gas line;
a plasma reactor coupled to the gas line and the actuator control, the plasma reactor including:
a chuck assembly; and
an active showerhead located above the chuck assembly, the active showerhead including:
a plurality of substrate layers, wherein the plurality of substrate layers include an actuator and transfer component coupled to the actuator control, wherein the actuator and transfer component is coupled to the gas line via a gas channel;
an electrode layer located below the plurality of substrate layers, wherein the electrode layer and the actuator and transfer component share an opening that leads to a mixing chamber,
wherein the actuator control is configured to control the actuator and transfer component to allow passage of one or more process gases received from the gas line and the gas channel via the opening into the mixing chamber,
wherein the active showerhead further includes a measurement layer located above the plurality of substrate layers, wherein the measurement layer has integrated therein a metrology tool, wherein the gas channel is routed via the measurement layer to allow the metrology tool to measure a parameter associated with the one or more process gases.

2. The system of claim 1, wherein the active showerhead includes a gas reservoir layer for storing the one or more process gases.

3. The system of claim 1, wherein the plurality of substrate layers include a second actuator and transfer component, the system further including a second gas line, wherein the second actuator and transfer component is coupled to the second gas line via a second gas channel.

4. The system of claim 3, wherein the electrode layer and the second actuator and transfer component share a second opening that leads to the mixing chamber.

5. The system of claim 4, wherein the actuator control is configured to control the second actuator and transfer component to allow passage of one or more process gases received from the second gas line and the second gas channel via the second opening into the mixing chamber.

6. The system of claim 4, wherein the electrode layer has a plurality of openings extending through the electrode layer, wherein the plurality of openings includes the opening and the second opening.

7. The system of claim 4, further comprising:
an insulator layer located below the measurement layer;
a gas reservoir layer located below the insulator layer for storing the one or more process gases;
a substrate support layer located below the gas reservoir layer, wherein the plurality of substrate layers are located below the substrate support layer.

8. The system of claim 7, further comprising a showerhead plate located below the mixing chamber, wherein the showerhead plate and the chuck assembly are placed apart from each other to form a gap therebetween.

9. The system of claim 8, wherein the one or more process gases are transferred via the mixing chamber and the showerhead plate to the gap between the showerhead plate and the chuck assembly.

10. The system of claim 1, wherein the actuator and transfer layer is coupled to the measurement layer via the gas channel.

11. An active showerhead comprising:
a plurality of substrate layers, wherein the plurality of substrate layers include an actuator and transfer component, wherein the actuator and transfer component is configured to be coupled to a gas line via a gas channel;
an electrode layer located below the plurality of substrate layers, wherein the electrode layer and the actuator and transfer component share an opening that leads to a mixing chamber,
wherein the actuator and transfer component is configured to allow passage of one or more process gases received from the gas line and the gas channel via the opening into the mixing chamber; and
a measurement layer located above the plurality of substrate layers, wherein the measurement layer has integrated therein a metrology tool, wherein the gas channel is routed via the measurement layer to allow the metrology tool to measure a parameter associated with the one or more process gases.

12. The active showerhead of claim 11, further comprising a gas reservoir layer for storing the one or more process gases.

13. The active showerhead of claim 11, wherein the plurality of substrate layers include a second actuator and transfer component, wherein the second actuator and transfer component is configured to be coupled to a second gas line via a second gas channel.

14. The active showerhead of claim 13, wherein the electrode layer and the second actuator and transfer component share a second opening that leads to the mixing chamber.

15. The active showerhead of claim 14, wherein the second actuator and transfer component is configured to allow passage of one or more process gases received from the second gas line and the second gas channel via the second opening into the mixing chamber.

16. The active showerhead of claim 14, wherein the electrode layer has a plurality of openings extending through the electrode layer, wherein the plurality of openings includes the opening and the second opening.

17. The active showerhead of claim 11, further comprising:
   an insulator layer located below the measurement layer;
   a gas reservoir layer located below the insulator layer for storing the one or more process gases;
   a substrate support layer located below the gas reservoir layer, wherein the plurality of substrate layers are located below the substrate support layer.

18. The active showerhead of claim 11, further comprising a showerhead plate located below the mixing chamber.

19. The active showerhead of claim 18, wherein the one or more process gases are transferred via the mixing chamber and the showerhead plate to a gap below the showerhead plate.

\* \* \* \* \*